(12) United States Patent
Wohlgethan

(10) Patent No.: US 10,236,788 B2
(45) Date of Patent: Mar. 19, 2019

(54) TEMPERATURE-COMPENSATED RECTIFYING COMPONENT

(71) Applicant: Thermo Fisher Scientific (Bremen) GmbH, Bremen (DE)

(72) Inventor: Sven Wohlgethan, Bremen (DE)

(73) Assignee: Thermo Fisher Scientific (Bremen) GmbH, Bremen (DE)

( * ) Notice: Subject to any disclaimer, the term of this patent is extended or adjusted under 35 U.S.C. 154(b) by 0 days.

(21) Appl. No.: 15/676,371

(22) Filed: Aug. 14, 2017

(65) Prior Publication Data

US 2018/0048245 A1  Feb. 15, 2018

(30) Foreign Application Priority Data

Aug. 15, 2016 (GB) .................... 1613958.6

(51) Int. Cl.
*H02M 7/06* (2006.01)
*H01J 49/06* (2006.01)
*H01L 23/34* (2006.01)
*H01J 49/10* (2006.01)
*H02M 1/15* (2006.01)
*H01J 49/02* (2006.01)

(52) U.S. Cl.
CPC .............. *H02M 7/06* (2013.01); *H01J 49/063* (2013.01); *H01J 49/105* (2013.01); *H01L 23/34* (2013.01); *H02M 1/15* (2013.01); *H01J 49/022* (2013.01)

(58) Field of Classification Search
CPC .. H03D 1/10; H03D 1/06; H03D 1/04; H03D 3/004; G01R 21/14; G05D 23/1934; G05D 23/32; H01J 49/022
USPC ............... 327/513, 512; 324/648, 685, 721; 329/352, 370, 366; 330/289
See application file for complete search history.

(56) References Cited

U.S. PATENT DOCUMENTS 4,791,380 A * 12/1988 Chiappetta ............... H03D 1/06
327/513
5,268,601 A * 12/1993 Cossins ..................... H03F 1/30
285/23
5,659,253 A *  8/1997 Busking ................... H03D 1/10
324/645

(Continued)

FOREIGN PATENT DOCUMENTS

JP    10-267970 A    10/1998
JP    10-285058 A    10/1998

(Continued)

*Primary Examiner* — David A Vanore
(74) *Attorney, Agent, or Firm* — David A. Schell

(57) ABSTRACT

A temperature-compensated rectifying component is configured to receive an input signal and comprises: a diode part, for rectifying the received input signal and providing a rectified output signal thereby, the diode part having an operational temperature; and a temperature compensation controller, configured to control a power dissipated by the diode part over a predetermined period of time, such that an average of the operational temperature over the predetermined period of time meets pre-set criteria. This may be used in a RF detector for generating a DC level from a RF input signal, which may form part of a control circuit for setting an amplitude of an RF potential for supplying to an electronic amplifier in an analytical instrument, such as an ion optical device.

15 Claims, 11 Drawing Sheets

(56) References Cited

U.S. PATENT DOCUMENTS

| | | | | | |
|---|---|---|---|---|---|
| 5,723,998 | A | * | 3/1998 | Saito | G06F 1/206 |
| | | | | | 327/362 |
| 5,732,332 | A | * | 3/1998 | Iida | H03F 1/0233 |
| | | | | | 455/117 |
| 5,873,029 | A | * | 2/1999 | Grondahl | G01R 21/12 |
| | | | | | 327/513 |
| 6,297,709 | B1 | * | 10/2001 | Wey | H03G 1/0058 |
| | | | | | 333/17.1 |
| 6,373,236 | B1 | * | 4/2002 | Lemay, Jr. | G01R 21/10 |
| | | | | | 323/369 |
| 6,825,715 | B2 | * | 11/2004 | Andle | H03D 1/10 |
| | | | | | 327/332 |
| 8,422,969 | B2 | * | 4/2013 | Wang | H03F 3/45475 |
| | | | | | 455/114.3 |
| 8,952,745 | B2 | * | 2/2015 | Seshita | G01K 7/01 |
| | | | | | 327/512 |
| 2004/0217807 | A1 | | 11/2004 | Andle | |
| 2011/0037453 | A1 | | 2/2011 | Hulsmann | |
| 2018/0046207 | A1 | * | 2/2018 | Wohlgethan | B32B 37/06 |
| 2018/0048245 | A1 | * | 2/2018 | Wohlgethan | H01J 49/063 |

FOREIGN PATENT DOCUMENTS

| | | | |
|---|---|---|---|
| JP | 2000-022447 | A | 1/2000 |
| JP | 2000-077025 | A | 3/2000 |
| WO | 2009/148367 | A1 | 12/2009 |

\* cited by examiner

TEMPERATURE-COMPENSATED RECTIFYING COMPONENT

TECHNICAL FIELD OF THE INVENTION

The invention concerns a temperature-compensated rectifying component, which may form part of an RF detector for generating a DC level from a RF input signal. Such an RF detector is also provided, together with a control circuit for setting an amplitude of an RF potential for supplying to an electronic amplifier in an analytical instrument using this RF detector and an ion optical device. The analytical instrument may be a mass spectrometer comprising an ion optical device, such as a quadrupole mass filter.

BACKGROUND TO THE INVENTION

Techniques for converting an AC voltage to an equivalent DC voltage representing the amplitude of the AC voltage are well-known in many electrical or electronic systems. In the field of ion processing and mass spectrometry, a Radio Frequency (RF) detector uses such techniques to transform the RF voltage to a corresponding signal indicative of the amplitude of the RF voltage as a DC voltage, as part of a closed-loop control circuit to maintain the amplitude of the RF voltage as constant. It will be understood that such a DC voltage is not strictly a DC voltage of a constant amplitude over time. Rather, the DC voltage is a signal having a DC level that indicates the amplitude of the RF voltage, which can be constant over the time but also change gradually over the time depending on the transformed RF voltage as an input.

The closed-loop control circuit may form part of an ion optical device, such as a quadrupole, an ion trap, collision cell or an ion optical lens. Variation in the amplitude of the RF potential may affect the electric field to which the ions are subjected in the ion optical device, causing undesirable effects such as inaccurate measurements and loss of ions.

The current-voltage (I-V) characteristics of the components used in AC to DC conversion will have a significant effect on the DC output level. In particular, active components often used for rectification have current-voltage characteristics that vary non-linearly with respect to temperature. For example, the currently most used semiconductor material is silicon doped with different other chemical elements and combined to form a PN-junction. This junction has a temperature dependency in that the relationship between the voltage across the junction and the current through depends on the junction temperature.

Referring to FIG. 1, there is shown a known relationship between the current through a diode ($I_D$) and the voltage across the diode ($U_D$) and how this varies with respect to temperature. This relationship is shown in both graphical and mathematical forms. Every semiconductor has an intrinsic ohmic part (generally around 15-30Ω for a diode) in its current path, so some power loss will occur, even in normal operation. A consequence of this power loss is that the semiconductor PN-junction or metal-semiconductor Schottky junction of the diode will increase in temperature. Thus, as shown in FIG. 1, such an effect is self-amplifying and a stable condition will not be reached on its own. A diode generally also has a parasitic capacitance of no more than about 1 pF.

Referring next to FIG. 2, there is depicted a typical existing circuit of a RF detector for converting an input AC voltage signal 10 to a corresponding DC voltage 60 using a diode 20, together with a graph illustrating the relationship between the input voltage ($U_{rf}$) and the power dissipated in the diode ($P_D$). Such a design is used, for example, in the Inductively Coupled Plasma (ICP) mass spectrometer marketed by Thermo Fisher Scientific (TM) under the brand name "iCAP", models "Q" and "RQ". The RF detector is normally used in an electronic closed-loop circuit, to hold the amplitude of the RF signal at a desired, constant level. The RF detector comprises: the diode 20; a resistor 30; a capacitor 40; and an inductor 50. The capacitor 40 and inductor 50 form a low pass filter, so that the DC output 60 has a low ripple. Due to the use of a semiconductor (the diode 20) as the rectifying element, this configuration is temperature dependent. The relationship between voltage and the power dissipated in the diode (which is closely linked to the diode temperature, $T_D$) is highly nonlinear. This results in the relationship between the amplitude of the AC input 10 and the DC voltage level 60 being nonlinear with respect to temperature as well.

Hence, temperature effects will cause a DC offset voltage error at the output 60 of the RF detector circuit. This DC offset voltage also has a nonlinear relationship with respect to the incoming AC voltage 10, because a higher incoming voltage 10 will cause a higher current in the diode (and potentially other components), more power loss and therefore more heat in the diode, changing its current-voltage characteristic. This is particularly a problem when high power inputs are provided, such as for an RF potential to be provided to an ion optical device.

It is also known to maintain the circuit at a constant temperature by external temperature control, as considered in U.S. Pat. Nos. 2,221,703 and 2,930,904, for instance. For example, a temperature sensor may be used to detect the temperature and a heater may then increase the temperature if it is below a desired level, by closed-loop feedback. The temperature is typically maintained at a temperature higher than room temperature thereby. The idea behind this approach is to eliminate heat-related error sources in the rectifying component itself. By holding the temperature constant, the voltage from the detector may be kept precise and stable over time, even with temperature changes.

With reference to FIG. 10, there is schematically shown an arrangement of components for an existing ambient temperature-compensated RF detector circuit 500. The circuit 500 comprises: rectifying diodes 520; load resistors 530; a capacitor 540; an inductor 550; heating resistors 560; a transistor 570; an operational amplifier 580; and passive control components 590. These are mounted on a printed circuit board (PCB). In view of the electrical requirements, the components are typically laid out in a symmetrical fashion, indicated by symmetry line 501.

A temperature sensor 595 measures the temperature at a chosen point on the PCB and an according amount of heat is provided to keep the temperature stable. The rectifying diodes 520, load resistors 530, capacitor 540 and inductor 550 are the heated components 510 forming the RF detector (for instance as shown in FIG. 2). The transistor 570, located below the heated components 510 on the PCB, controls the current through the heating resistors 560, which maintain the heat level. The transistor 570 is controlled by the operational amplifier 580 and its associated passive control components 590, to set the heating level. This closed-loop control circuit is located below the actuating transistor 570.

The heating resistors 560 convert the electrical power determined by the current supplied to heat energy to heat the components 510, which they surround. The transport of the heat is mainly realised by thermal conduction through the PCB material, which is typically made from an FR4 material. This arrangement is intended to provide a constant temperature when the ambient temperature is in the range of 15° C. to 35° C.

This approach has several drawbacks. Firstly, the flow of heat through the circuit is non-uniform, making steady-state control difficult. Furthermore, each resistor has its own tolerance, making the amount of heat generated difficult to set. The actuator transistor 570 also represents an extra source of heat, getting hot as a consequence of its parasitic resistance, the high current running through it and the voltage between its collector and emitter. These effects create an uneven temperature on the surface of the PCB, and give a longer time constant to reach thermal equilibrium. In view of Ohm's law and the formula for electrical power ($P=I^2R$), a small change in current can cause a large change in the power dissipated and consequent heating effect. This non-linear relationship makes control even trickier.

The intention of this technique is generally to reduce any influences that room temperature changes might have on the output. In some scenarios, controlling the circuit temperature in this way is less effective, particularly when high power input signals are provided. The heat generated by the circuit (self-heating), especially the diode, may therefore have a significant impact on the performance. The relationship between the current-voltage relationship and temperature may be linear, but is typically non-linear (quadratic or logarithmic). The close proximity of the components makes the relationship even more unpredictable. Moreover, the area of the whole circuit is much larger than the small die size of a component, such as the diode. Hence, the time to make a temperature change in a component can be magnitudes smaller than the time for the entire circuit board temperature to change by the same amount. This makes the use of such ambient temperature compensation techniques to mitigate the self-heating effect very challenging.

Providing a circuit, for instance using a rectifying component (such as a diode) and particularly for operation with high input voltages and/or powers, with a current-voltage characteristic having a reduced (preferably minimal or negligible) temperature dependence and/or a stable operation temperature would therefore be highly advantageous.

SUMMARY OF THE INVENTION

Against this background, there is provided a temperature-compensated rectifying component in line with claim 1, an RF detector in accordance with claim 12, a control circuit as provided by claim 15 and an ion optical device as defined in claim 17. Further features of the invention are detailed in the dependent claims.

In order to control the operational temperature of a diode (a semiconductor PN-junction), which provides the rectification, a temperature compensation controller is used to control the power dissipated by the diode and/or an associated circuitry that affects the diode's temperature. This control is used, so that over a predetermined period of time (for example, a defined number of input samples to the diode), the average operational temperature of the diode (particularly, an arithmetic average or mean) meets specific criteria.

There is a direct mapping between the power dissipated and the diode's temperature. Therefore, the control is desirably set such that the total power dissipated over the period of time is a set level and consequently, the average diode operational temperature meets a specific level. In particular, the control preferably causes the diode operational temperature over repeated periods of time to be approximately constant (within a small variation, normally less than 10%). In this way, the thermal changes in a PN-junction or a Schottky junction of diodes are greatly improved, to reduce or remove voltage errors in rectifying AC or RF voltages, particularly for high performance and/or high accuracy detectors of RF voltages. This may mitigate the accuracy-limiting influences of self-heating effects in a rectifying diode (or diodes) of an RF detector for closed-loop operation of a power supply. The power supply is especially for providing RF potentials to an ion optical device, such as a quadrupole device (mass filter or mass analyser) and/or an ion trap. This approach may be implemented by the use of a compensating current in the semiconductor diode to lower self-induced heating effects.

Two practical implementations are contemplated. The first is a hardware embodiment. A first diode rectifies the input signal and provides the rectified output thereby. At least one further diode is advantageously provided, thermally coupled to the first diode (such that the temperatures of the first diode and the at least one further diode are the same, for example if the two diodes are provided in the same semiconductor package). By setting the power dissipated by the at least one further diode (which may be controlled largely independently from the power dissipated by the first diode), the temperature of the diodes can be set as desired. The further diode may include a second diode coupled to a compensation current source, that provides a compensation current to the second diode. The compensation current is set based on the operational temperature of the first diode (which will be the same as that of the second diode, due to their thermal coupling). Specifically, the compensation current is adjusted in an inverse relationship to the diode operational temperature (such that the compensation current is reduced as the temperature increases and vice versa). The diode operational temperature may be sensed by means of a third diode, thermally coupled to the first and second diodes. A constant current may be drawn through the third diode, such that the potential at the third diode's anode (with respect to ground, for example) indicates the diodes' operational temperature. The compensation current provided to the second diode can then be set based on the third diode's anode potential. An operational amplifier may set the compensation current based on the third diode's anode potential.

A second implementation controls the power dissipated in the diode rectifying the input signal, rather than another component. The predetermined period of time is divided into two portions, which do not overlap (and are preferably continuous with each other and/or each uninterrupted). During the first portion, the diode beneficially provides the rectified output signal based on the received input signal. During the second portion, the diode provides the rectified output signal based on a compensation signal that is set such that the power dissipated by the diode over the total period of time (that is, both portions) meets a set level. In this way, the average diode temperature over the total period of time is controlled. The amplitude of the compensation signal, the duration of the second portion or both can be set, to control the power dissipated.

The temperature-compensated rectifying component typically forms part of a larger circuit, for example a bridge rectifier circuit and/or an RF detector circuit. An RF detector for generating a DC level from a RF input signal may comprise: a rectification stage that receives the RF input signal and provides the rectified RF signal thereby, using at least one temperature-compensated rectifying component as disclosed herein; and a low pass filter that provide a signal indicative of the amplitude of the RF input signal (notionally termed a DC level) from the rectified RF signal. Typically, the RF detector has a plurality of temperature-compensated rectifying components, for instance forming a bridge rectifier. The RF detector may also comprise an ambient temperature compensator that heats the diode part when the diode's operational temperature is less than a set temperature.

A control circuit for setting an amplitude of an RF potential for supplying to an electronic amplifier in an analytical instrument (such as an ion optical device in a mass spectrometer) may comprise: a controller (for example, a proportional-integral-derivative, PID, controller), receiving an RF signal from an RF generator and a signal (DC level) indicative of the amplitude of the RF potential and generating an RF output from the received RF signal, adjusted on the basis of the received signal indicative of the amplitude of the RF potential; an output circuit that generates the RF potential for supplying to an ion optical device from the RF output of the controller; and the RF detector as disclosed herein that receives the RF potential and generates the signal indicative of the amplitude of the RF potential for the controller. The control circuit may further comprise an RF amplifier that receives the RF output from the controller and amplifies the RF output. Additionally or alternatively, the control circuit may further comprise a transformer, which receives the (amplified) RF output as a primary-side input and provides the RF potential as a secondary-side output. An ion optical device is further considered, comprising: an electrode arrangement for generating an RF electrical field using a received RF potential; an RF generator, generating an RF signal; and a control circuit as described herein, that receives the RF signal from the RF generator and provides the RF potential to the electrode arrangement. The ion optical device is preferably a quadrupole ion optical device, such as a quadrupole ion trap, quadrupole ion guide or quadrupole mass filter.

BRIEF DESCRIPTION OF THE DRAWINGS

The invention may be put into practice in a number of ways, and a preferred embodiment will now be described by way of example only and with reference to the accompanying drawings, in which.

DETAILED DESCRIPTION OF A PREFERRED EMBODIMENT

Figure 3:
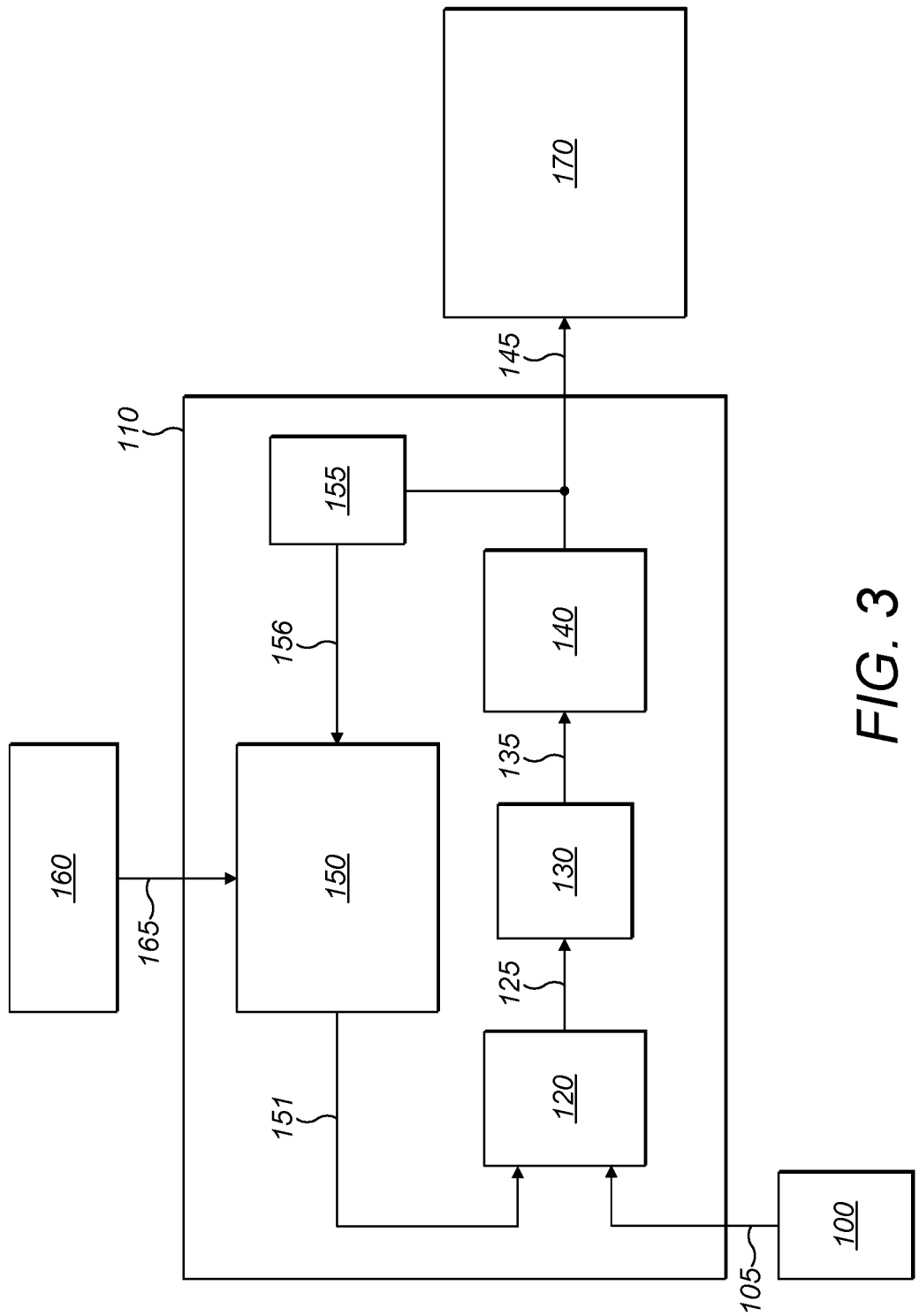
FIG. 3 shows a closed-loop controlled RF potential power supply for an ion optical device, using an RF detector.

Referring to FIG. 3, there is shown a closed-loop controlled RF potential power supply for an ion optical device, using an RF detector. This is depicted in a schematic form, as a block diagram. The power supply comprises: an RF signal generator 100; a closed-loop amplitude control circuit 110; and an ambient temperature compensation part 160. The power supply provides a controlled RF potential 145 as an output. This is provided to an ion optical device, such as a quadrupole mass filter or mass analyser 170.

The RF signal generator 100 generates an RF signal 105, which is provided as an input to the closed-loop amplitude control circuit 110. The closed-loop amplitude control circuit 110 comprises: a controller 120; an RF amplifier 130; a transformer 140; and an RF detector 150. The controller 120, which is typically a proportional-integral-derivative (PID) controller, provides as an output, a controlled RF signal 125 to the RF amplifier 130. The RF amplifier 130 amplifies the controlled RF signal 125 and provides an amplified RF signal 135 to the RF transformer 140. The secondary side output of the RF transformer 140 provides the controlled RF potential 145. The controlled RF potential 145 is also provided as an input to the RF detector 150 via a voltage divider 155. The voltage divider 155 thereby provides a divided controlled RF potential 156. The RF detector 150 converts the received divided controlled RF potential 156 into a DC level 151, which is indicative of the amplitude of the controlled RF potential 145. The input to the RF detector from the voltage divider 155 is typically around 1 to 20 V at a frequency of around 1 to 10 MHz. The DC level 151 is provided as an input to the controller 120, together with the RF signal 105 from the RF signal generator 100, in order to generate the controlled RF signal 125 thereby. In order to maintain the ambient temperature of the closed-loop amplitude control circuit 110 at a set level, the ambient temperature compensation part 160 measures the ambient temperature and provides heat 165 if needed to keep the ambient temperature at a set level.

A number of specific improvements in this power supply will now be described, especially with reference to the RF detector 150 and the ambient temperature compensation part 160.

Improved RF Detector Design

Figure 2:
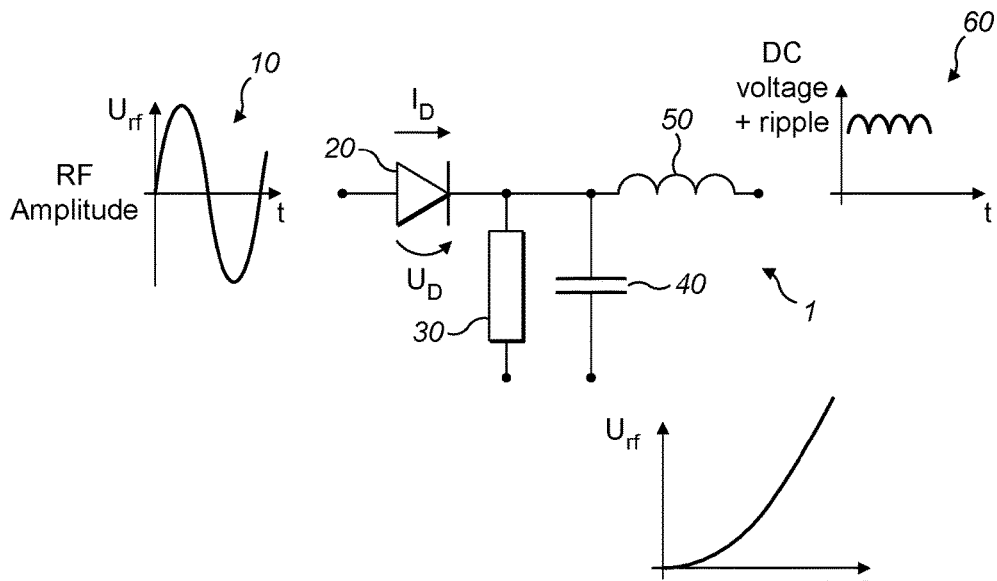
FIG. 2 depicts a typical existing circuit of a RF detector for converting an input AC voltage signal to a corresponding DC voltage using a diode, together with a graph illustrating the relationship between the input voltage and the power dissipated in the diode.

The design of the RF detector 150 shown in FIG. 3 has previously been in accordance with FIG. 2, as discussed above. The RF detector 150 uses at least one semiconductor diode (comprising a semiconductor junction, in the form of a PN or Schottky junction) in order to rectify its RF input and convert to a DC level. An improved design of RF detector compared with that shown in FIG. 2 is therefore desirable, in view of the sensitivity to temperature that such diodes can exhibit.

It has been recognised that, keeping the power dissipated or lost in the diode at a fixed (preferably constant) level over time mitigates the non-linear effects of diode self-heating by avoiding significant temperature changes in the diode. Thus, the I-V characteristic of the diode becomes temperature independent and any offset caused by the power loss in the diode no longer depends on the total or average input signal power.

In general terms, there may therefore be considered a temperature-compensated rectifying component, configured to receive an input signal. The temperature-compensated rectifying component comprises a diode part, for rectifying the received input signal and providing a rectified output signal thereby. The diode part has an operational temperature. The temperature-compensated rectifying component advantageously further comprises a temperature compensation controller, configured to control (preferably, directly) a power dissipated by the diode part over a predetermined period of time, such that an average of the operational temperature over the predetermined period of time meets pre-set criteria.

A method of manufacturing and/or operating a temperature-compensated rectifying component, an RF detector, a control circuit for setting an amplitude of an RF potential for supplying to an electronic amplifier in an analytical instrument (such as an ion optical device in a mass spectrometer), an ion optical device and/or a mass spectrometer having one or more functional steps corresponding with functionality of any specific apparatus or device herein is also provided. The ion optical device is preferably a quadrupole ion optical device, such as a quadrupole ion trap or quadrupole ion guide.

The diode part is preferably for rectifying an RF input signal. The diode part is preferably for rectifying an RF input signal, for example with a frequency of at least 50 kHz, 100 kHz, 1 MHz, 2 MHz, 5 MHz or 10 MHz and/or no more than 5 MHz, 6 MHz, 7 MHz, 8 MHz, 9 MHz or 10 MHz. The range of frequencies may be between 1 MHz and 10 MHz, 1 MHz and 8 MHz, 1.5 MHz to 6 MHz or 3 MHz to 5 MHz, for instance. However, the diode part may be suitable for rectifying RF input signals up to 1 GHz, in some cases. Typically, the diode part is for rectifying an input signal of as low as 1V, 3V or 5V and/or as high as 7V, 10V, 15V or 20V. The diode part may be for rectifying an input signal having a power of as low as 1 W, 3 W, 5 W or 10 W and/or as high as 10 W, 15 W, 20 W, 25 W or 30 W. The diode part beneficially comprises a semiconductor diode, for instance made from silicon, germanium, SiGe, GaAs, GaN, SiC or a combination of materials. The semiconductor diode may be a PN junction diode or a Schottky diode (with a metal-semiconductor interface). A Schottky diode is advantageous in view of a number of factors. Firstly, its switching time from forward to reverse bias (for example around 10 ns) is typically much less than for a silicon diode (normally about 100 ns). Also, its performance is usually less temperature dependent and its parasitic capacitance is generally smaller than a PN junction diode.

Preferably, the temperature compensation controller is configured to control a total power dissipated by the diode part over the predetermined period of time to be a set level. This is particularly such that the average of the operational temperature over the predetermined period of time is (approximately) constant. In this context, the average of the operational temperature over the predetermined period of time is typically understood as an arithmetic average. In particular, the pre-set criteria may be that the power dissipated by the diode part and/or the average of the operational temperature over the predetermined period of time is constant (that is a set value) or does not vary by more than 20%, 15%, 10%, 5%, 2% or 1% from a set value. In another sense, the average of the operational temperature over the predetermined period of time may not vary by more than 1° C., 2° C., 5° C., 10° C. or 15° C. Additionally or alternatively, the temperature compensation controller may be configured to control the power dissipated by the diode part over the predetermined period of time, such that the power dissipated by the diode part and/or the average of the operational temperature over the predetermined period of time does not exceed a first threshold and does not go below a second threshold. The first and/or second thresholds may be set with reference to the maximum variation discussed above. The first threshold is normally less than 100° C. The predetermined period of time may be 1 s, 2s, 5 s, 10 s, 20 s, 25 s, 30 s, 40 s or 45 s.

In the description herein relating to temperature compensation for a component (especially with reference to FIG. 2 above and FIGS. 4 and 7 below), the rectifying diode has been shown as a single diode acting to rectify the received AC potential. However, a more common implementation would use at least four diodes in a Graetz bridge rectifier configuration. In fact, each of the four diodes could be implemented by two or more parallel diodes, to mitigate a high current load for each diode. In general terms, the temperature-compensated rectifying component may form part of a bridge rectifier circuit.

In further general terms and in another aspect, it will be understood that an RF detector may be provided. The RF detector is preferably for generating a DC level from a RF input signal and may comprise a rectification stage, configured to receive the RF input signal and provide a rectified RF signal thereby. The rectification stage advantageously comprises at least one temperature-compensated rectifying component in accordance with this disclosure. The RF detector may further comprise a low pass filter, arranged to provide a signal indicative of the amplitude of the RF input signal as a DC level from the rectified RF signal. In particular, the low pass filter is configured to suppress unwanted higher harmonic components of the rectified input RF signal (in other words, reducing ripple voltage). In the preferred embodiment, the at least one temperature-compensated rectifying component is a plurality of temperature-compensated rectifying components, for example forming a bridge rectifier. Optionally, the RF detector further comprises an ambient temperature compensator, configured to heat the diode part in response to a determination that the operational temperature of the diode part is less than a set temperature.

Two specific implementations to achieve this fixed or constant power dissipation are presented. Each of these can be considered a specific example of a broader category of techniques, as will now be discussed. The first of these two approaches is currently preferred.

Secondary-diode Approach

The basic principle of this approach is that, as well as the diode used for rectifying the (RF) input potential (a "first" diode), a second diode is provided. The second diode is thermally coupled to the first diode, such that the temperatures of the first and second diodes are closely linked and essentially the same. This may be the case if the first and second diodes are provided in the same device package (a multi-device package), for example in the form of an integrated circuit, chip or similar. The power dissipated through the second diode may be controlled on the basis of the package temperature (which is largely a function of the power dissipated by the first diode), in order to keep the total power dissipated by the package, which will be the sum of the power dissipated through both the first and second diodes, at a constant and/or set level. In so doing, the package temperature and therefore the temperature of the first diode, is regulated. In principle, multiple "second" diodes could be provided in accordance with this approach, although this would require the power dissipated by each "second" diode to be controlled based on the first diode.

In general terms, as detailed above, the diode part may be considered to comprise a first diode, arranged to receive the input signal and configured to rectify the input signal, so as to provide the rectified output signal. Then, the diode part may further comprise at least one further diode, thermally coupled to the first diode (such that its temperature changes in accordance with that of the first diode and preferably such that the temperatures of the first diode and at least one further diode are the same). The temperature compensation controller is advantageously configured to set a power dissipated by the at least one further diode based on a power dissipated by the first diode and such that the total power dissipated by the first diode and the at least one further diode over the predetermined period of time is a set level. The power dissipated by the at least one further diode may be set based on or adjusted in an inverse relationship to the operational temperature of the diode part. In a preferred embodiment, the at least one further diode may comprise a second diode (thermally coupled to the first diode, as discussed above). Then, the temperature compensation controller comprises a compensation current source, configured to provide a compensation current to the second diode. The compensation current may be set to control the power dissipated by the at least one further diode, in accordance with the parameters identified herein.

Figure 4:
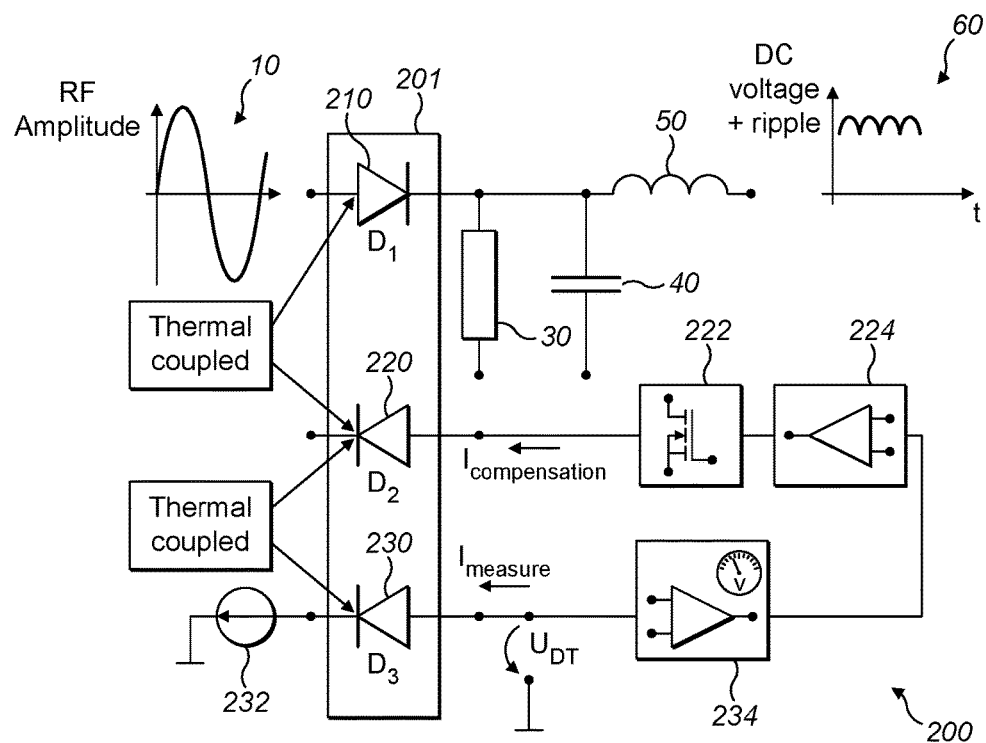
FIG. 4 illustrates an RF detector in accordance with a first embodiment of the disclosure, using multiple diodes.

Referring next to FIG. 4, there is illustrated an RF detector 200 in accordance with this first embodiment, using multiple diodes. This can be considered a hardware implementation (in contrast with a second embodiment, discussed below). Where components common with those of the RF detector 1 of FIG. 2 are shown, the same reference numerals have been used. The RF detector 200 comprises: a diode package 201; a resistor 30; a capacitor 40; and an inductor 50. The diode package 201 comprises: a first diode 210; a second diode 220; and a third diode 230. The first diode 210, second diode 220 and third diode 230 are all in the same package (and typically on the same component or die or in the same housing) and therefore all thermally coupled to one another. The area size of the component making up the first diode 210, second diode 220 and third diode 230 may be around 0.5 mm². Many high frequency diodes on the market are available not only in a single unit package rather than in two, triple or quad configuration. The size of the component in which the diodes are embedded (for example, the continuous die area covering all the diodes) is small and consequently, the thermal coupling between the diodes is very good, with a small delay time constant between temperature changes.

The purpose of the first diode 210 is to rectify input AC voltage signal 10 to provide signal 60, which is then processed by a low pass filter (formed by the resistor 30, capacitor 40 and inductor 50) to provide a corresponding signal indicative of the amplitude of the RF input signal without ripple. The second diode 220 is intended to provide additional power dissipation to control the temperature, as discussed above. The power dissipation of the second diode 220 is controlled by a compensation current ($I_{compensation}$). The compensation current is generated based on the temperature of the diode package 201.

In principle, the package temperature may be determined by a temperature sensor. This is efficiently effected in this embodiment using the third diode 230. A constant current source (CCS) 232 injects a small current, $I_{measure}$, through the third diode 230. The current from the CCS 232 is calculated such that no significant self-temperature effects can occur. Therefore, the voltage drop across the PN-junction of the third diode 230 indicates the temperature of the third diode 230 (and therefore the temperature of the package 201). This therefore sets the potential at the anode of the third diode 230 with respect to ground, UDT. An operational amplifier 234 measures this voltage, which is further amplified by amplifier 224 and transistor power amplifier 222 to provide the compensation current to the second diode 220. The transistor power amplifier 222 is provided for higher compensation, if the operational amplifiers 224, 234 cannot deliver enough current, but can be omitted if not needed. This configuration may effectively form a closed loop operational circuit, converting an input voltage to an output current.

An example operation of this RF detector 200 may be helpful to understand the temperature regulation. Firstly, assume a non-zero current is flowing in through the second, compensation diode 220 and that the temperature of all three diodes (that is, the temperature of the package 201) is stable. Then, the amplitude of the RF input signal 10 increases, causing a higher current through the first diode 210. This causes the temperature of the first diode 210 to rise. The temperature of the third diode 230 will also rise, because of the close coupling of the diodes (and indeed, the temperature of the second diode 220 and the package 201 will also rise). In view of the relationship shown in FIG. 1 for the voltage drop based on the temperature (the upper formula), the voltage drop across the third diode 230 will change to a lower value (−2 mV/K). This change in voltage drop will cause UDT to reduce and this will be picked up by the operational amplifier 234. As a result, the compensation current $I_{compensation}$ will also go down, reducing the current through and therefore the power dissipated in the second diode 220. By appropriate calibration, the total power dissipated by the first diode 210, second diode 220 and third diode 230 therefore remains the same. The converse situation will be understood when the amplitude of the RF input signal 10 decreases, causing the voltage drop across the third diode 230 to increase and the power dissipated in the second diode 220 to increase.

Figure 5:
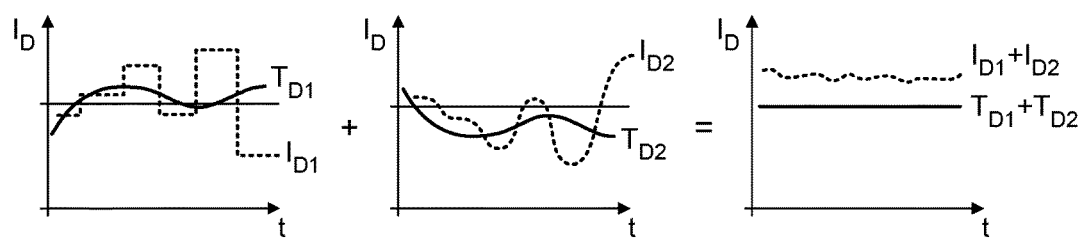
FIG. 5 shows plots of diode current against time for two diodes of the embodiment of FIG. 4, together with a plot showing the sum effect of the two diode currents against time.

The power dissipated in the second diode 220 D2 is thereby always inversely related to the power dissipated in the first diode 210. With reference to FIG. 5, there are shown plots of diode current against time for the first diode 210 (diode current $I_{D1}$) and the second diode 220 (diode current $I_{D2}$), together with a plot showing the sum effect of the two diode currents against time ($I_{D1}+I_{D2}$). In the left-hand plot, the current through the first diode 210 $I_{D1}$ is depicted, with varying levels. The middle plot shows the current through the second diode 220 $I_{D2}$, which will be seen to change inversely with respect to the current through the first diode 210. The right hand plot shows the sum effect of the two diodes over time, with the total power dissipated by the two diodes being constant over time and therefore, the temperature $T_{D1+D2}$ of the two diodes being maintained at a constant, fixed level, even with different load currents through the first diode 210.

Figure 6:
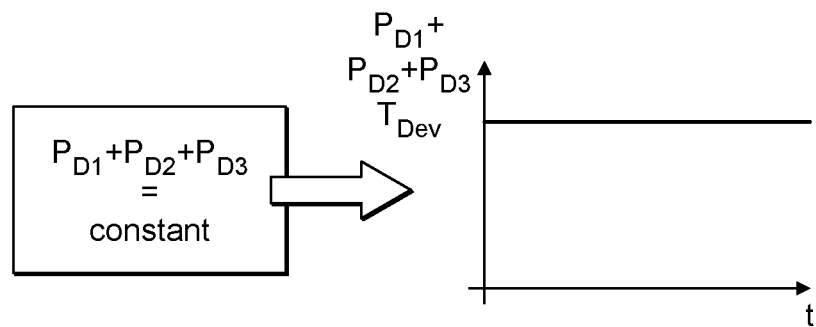
FIG. 6 shows a plot of the total power dissipated by three diodes of the embodiment of FIG. 4 against time.

Referring to FIG. 6, there is shown a plot of the total power dissipated by the first diode 210 ($P_{D1}$), the second diode 220 ($P_{D2}$) and the third diode 230 ($P_{D3}$) against time, which can be seen to be constant. The amplifiers 222, 224, 234, the first diode 210, the second diode 220, the third diode 230 and the CCS 232 therefore form a closed-loop circuit that maintains the power loss and therefore the temperature of the package 201 constant, without the previous problems of thermal changes of the characteristics for the rectifying (first) diode 210. Although three diodes are shown in these examples, it will be understood that for each of the first, second and third diodes may in practice comprise multiple diodes in series and/or parallel, operating together. Preferably from 2 up to 6 diodes are operated in series for each type of diode (that is, for each of the first, second and third diodes respectively).

One benefit of this implementation is that it is straightforward to implement at low cost. Moreover, no software changes are required to the way in which the input signal 10 is provided, in particular as part of the closed-loop controller of FIG. 3.

In general terms, the temperature-compensated rectifying component may further comprise a temperature sensor, configured to generate a signal indicative of the operational temperature of the diode part. The compensation current may then be generated in response to the signal indicative of the operational temperature of the diode part. For this to be effective, the temperature sensor is advantageously thermally coupled to the first and second diodes. The temperature sensor may be a third diode. For example, the at least one further diode may comprise a third diode, thermally coupled to the first and second diodes. Then, the temperature compensation controller may further comprise a constant current source, coupled to draw a constant current through the third diode. The potential at an anode of the third diode may thereby indicate the operational temperature of the diode part. Hence, the compensation current may set based on the potential at the anode of the third diode. The temperature compensation controller optionally comprises an operational amplifier circuit, configured to set the compensation current based on the potential at the anode of the third diode. The operational amplifier may be a transconductance amplifier, for instance.

Diode Current Control by Software

An alternative approach, in accordance with the general concept identified above, is to control the power dissipated in the rectifying diode, such that the power dissipated in the rectifying diode averages a fixed (constant) level within a time period. This is preferably implemented in software.

Figure 1:
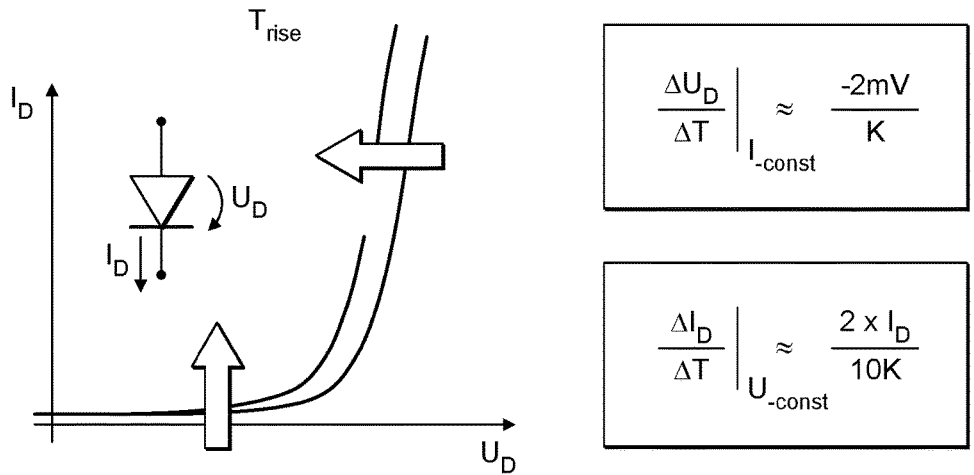
FIG. 1 shows a known relationship between the current through a diode and the voltage across the diode and how this varies with respect to temperature.
Figure 7:
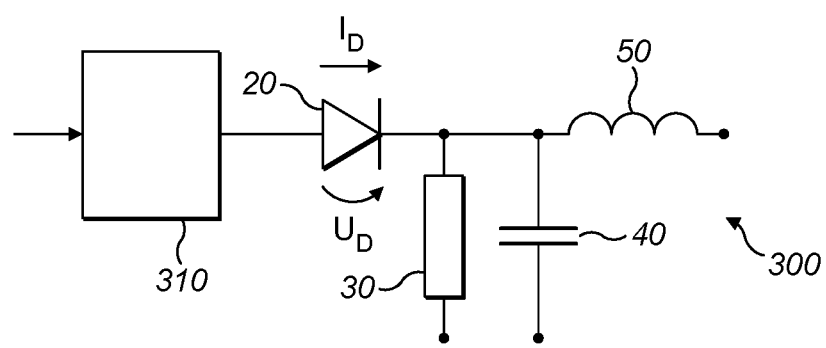
FIG. 7 illustrates an RF detector in accordance with a second embodiment of the disclosure.

Referring to FIG. 7, there is illustrated an RF detector 300 in accordance with a second embodiment. Where components common with those of the RF detector 1 of FIG. 1 are shown, the same reference numerals have been used. The RF detector 300 comprises: a software controller 310; a diode 20; a resistor 30; a capacitor 40; and an inductor 50. The diode 20, resistor 30, capacitor 40 and inductor 50 operate in the same way as described above with respect to FIG. 1. The software controller 310 controls the way that signals are applied to the diode 20 for rectification and therefore the power dissipated in the diode 20. In principle, the software controller 310 controls the power dissipated in diode 20 to average (in an arithmetic sense) a fixed and constant level over time. In other words, the mean power dissipated over time remains fixed. This is achieved by dissipating additional power in the diode during a dummy time period at regular intervals and will now be illustrated using examples.

Figure 8A:
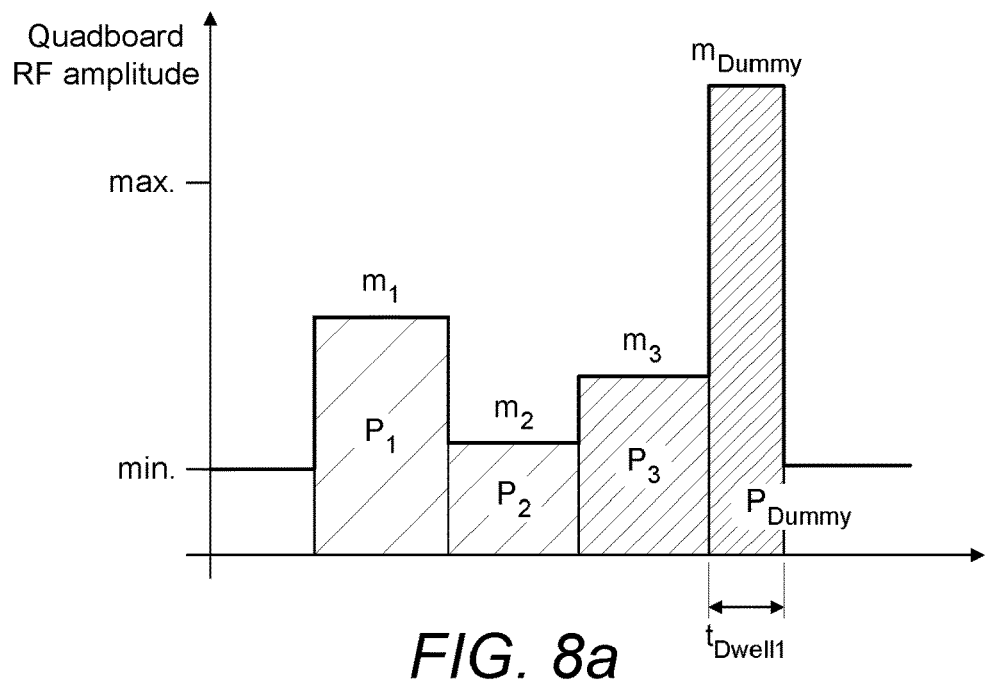
FIG. 8*a* depicts a first example of RF signal amplitude against time for operation of the RF detector of FIG. 7.

Referring to FIG. 8a, there is depicted a first example of RF signal amplitude against time for operation of the RF detector of FIG. 7. In a first time period, an RF signal of a first amplitude is rectified (corresponding with a quadrupole mass filter or mass analyser 170 capturing a first mass $m_1$) and a first power $P_1$ is dissipated. The power dissipated is dependent on the mass captured and/or filtering in the device 170 (or conversely, each mass of an ion is related to corresponding RF amplitude). In a second time period, an RF signal of a second amplitude is rectified (corresponding with a quadrupole mass filter or mass analyser 170 capturing and/or filtering a second mass $m_2$) and a second power $P_2$ is dissipated accordingly. Likewise, an RF signal of a third amplitude is rectified in a third time period (corresponding with a quadrupole mass filter or mass analyser 170 capturing and/or filtering a third mass $m_3$) and a third power $P_3$ is dissipated in correspondence.

Based on $P_1$, $P_2$ and $P_3$, the software controller 310 determines the average power dissipation over the combined first, second and third time periods. It then determines a duration of an additional time period and an additional power dissipation in order to set the average power dissipation over the combined first, second, third and additional time periods to equal the predetermined constant value desired. In this case, the duration of the additional time period is shown as $t_{Dwell1}$ and the determined additional power dissipation is shown as $P_{Dummy}$ (effectively, as if an ion of mass $m_{Dummy}$ is filtered by quadrupole mass filter 170). It is noted that the additional amplitude is preferably significantly higher than the maximum usable RF amplitude, to keep the dwell time short in comparison to the RF amplitude signals used for the analyser.

Figure 8B:
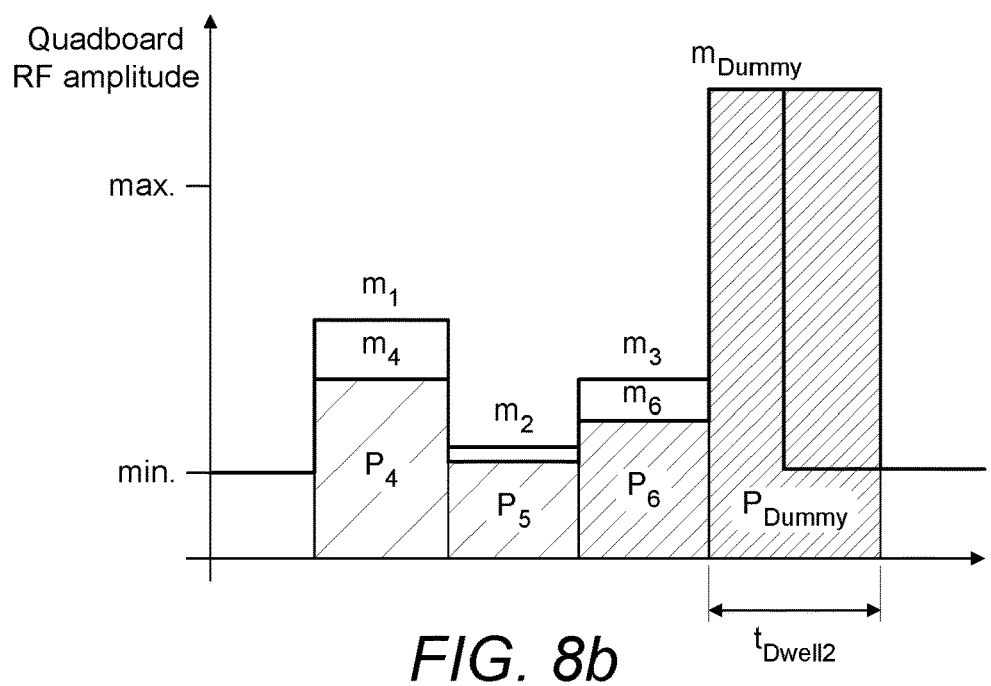
FIG. 8*b* depicts a second example of RF signal amplitude against time for operation of the RF detector of FIG. 7.

Referring to FIG. 8b, there is depicted a second example of RF signal amplitude against time for operation of the RF detector of FIG. 7. This is similar to the first example in some respects and for convenience, the power dissipations in the first example are also shown by way of comparison. In a fourth time period, an RF signal of a fourth amplitude is rectified (corresponding with a quadrupole mass filter 170 capturing and/or filtering a fourth mass $m_4$) and a fourth power $P_4$ is dissipated. In a fifth time period, an RF signal of a fifth amplitude is rectified (corresponding with a quadrupole mass filter 170 capturing and/or filtering a fifth mass $m_5$) and a fifth power $P_5$ is dissipated. An RF signal of a sixth amplitude is rectified in a sixth time period (corresponding with a quadrupole mass filter 170 capturing and/or filtering a sixth mass $m_6$) and a sixth power $P_6$ is dissipated. Based on $P_4$, $P_5$ and $P_6$, the software controller 310 determines the average power dissipation over the combined fourth, fifth and sixth time periods. It then determines a duration of a seventh time period and a seventh power dissipation in order to set the average power dissipation over the combined fourth, fifth, sixth and seventh time periods to equal the predetermined constant value desired (which will advantageously be the same as that used in the first example). In this case, the duration of the seventh time period is shown as $t_{Dwell2}$ and the determined seventh power dissipation is shown as $P_{Dummy*}$ (effectively, as if an ion of mass $m_{Dummy*}$ is filtered by quadrupole mass filter 170).

It will be noted that $t_{Dwell2}$ is greater than $t_{Dwell1}$ and $P_{Dummy}$ is equal to $P_{Dummy*}$ (or $m_{Dummy}$ and $m_{Dummy*}$ are the same). This is because the diode 20 has a maximum power dissipation. Therefore, the software controller 310 may not always be able to control the power dissipated in diode 20 to average a fixed level over time only by changing the dummy power dissipation. By adjusting the duration of the dummy time period and/or the dummy power dissipation, the average power dissipation can more efficiently and effectively be controlled. In practice, the maximum power dissipation is always used and only the duration of the dummy time period is adjusted, in order to keep the duration of the dummy time period as short as possible.

To summarise the above in a slightly different way, the area enclosed between the power dissipation (y-axis) and the time line (x-axis) may effectively represent the power loss in the rectifying diode 20. With this information and the adjustable dwell time of the dummy power, the area enclosed by the power dissipation chart over the time may be fixed at a constant level. A constant area means a constant power loss in the diode. In this way, the temperature in the diode is also keep constant and no change of error inducing thermal change can occur.

In general terms, the temperature compensation controller may be configured to control the operation of the diode part such that: during a first portion of the predetermined period of time, the diode part provides the rectified output signal based on the received input signal; and during a second portion of the predetermined period of time (non-overlapping with the first portion of the predetermined period of time), the diode part provides the rectified output signal based on a compensation signal. The compensation signal is advantageously set such that the power dissipated by the diode part over the predetermined period of time is a set level. Beneficially, the temperature compensation controller is configured to set the amplitude of the compensation signal and/or the duration of the second portion of the predetermined period of time such that the power dissipated by the diode part over the predetermined period of time is a set level. The temperature compensation controller may be implemented as a computer program in this way.

Such implementations may be less preferred to the secondary diode approach, discussed above. This is partly because controlling the diode current introduces overheads into the device, due to the additional time consumption when the dummy power is being dissipated, making it less efficient. This may be particularly unfavourable when measuring only small numbers of different masses (say, up to 10). In this case, an additional dwell time of 5 seconds or more for each run is potentially unfavourable. Nonetheless, there may be scenarios where this approach is preferable to the secondary diode approach. For example, it may be of benefit where hardware change in the RF detector is more difficult or not possible.

Improved Ambient Temperature Compensation

Figure 11:
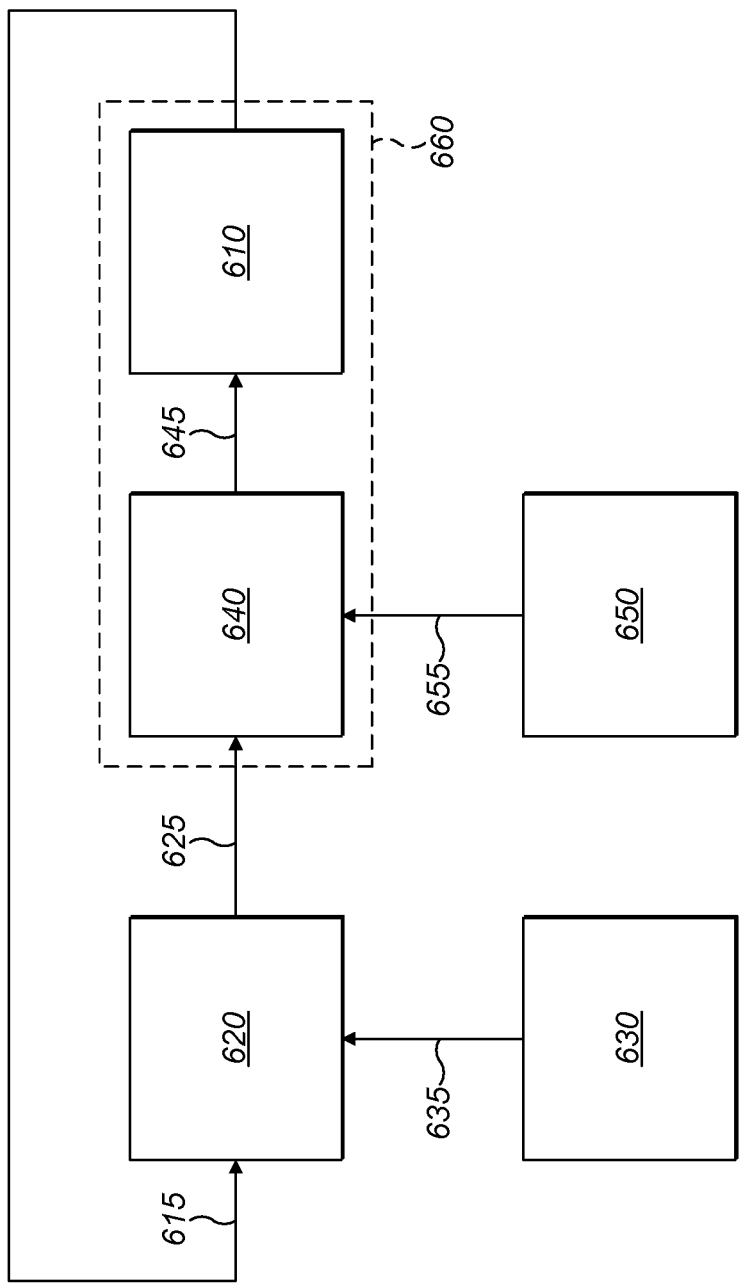
FIG. 11 depicts a block diagram of a thermal controller for an RF detector in accordance with a third embodiment.

Referring to FIG. 11, there is depicted a block diagram of a thermal controller for an RF detector in accordance with a third embodiment. The thermal controller comprises: a temperature sensor 610; a temperature control circuit 620; a voltage divider 630; a heating transistor 640; and a constant current source 650. Thermal shielding 660 is ideally provided to couple the heating transistor 640 and the temperature sensor 610.

The temperature sensor 610 measures the temperature of the circuit and provides a temperature signal 615 indicative of this measurement to the temperature control circuit 620. The temperature control circuit 620 is configured to generate a control signal 625, which controls the operation of the heating transistor 640 accordingly. The temperature control circuit 620 achieves this by comparing the temperature signal 615 with a set temperature level 635, which is indicative of a desired stable operating temperature and is set by the voltage divider 630 and may therefore be set and/or adjusted by a user, for example during calibration or initial set-up. The configuration of the components forming this thermal controller and the RF detector circuit (for instance, as described above with reference to FIG. 4 or 7) may have a significant effect on its performance.

As discussed above with reference to FIG. 10, existing approaches to implementing ambient temperature compensation have significant drawbacks, in particular due to the problems of self-heating, the non-linear correlation between the current-voltage relationship of the components and temperature, the close proximity of the components and the long time needed to effect a circuit board temperature change. In addition, further problems have been identified: uneven heat distribution on PCB surface due to poor symmetry in component placement; excessive self-heating of the components caused by high concentration of electronic devices; heat conduction being used as the main hear-transfer mechanism in view of planar placing of the heating source (or sources) on the PCB surface; and problems in accurate heat measurement because of dependence on the placement of a sensor. Together, these issues yield imperfect heat management, preventing a constant temperature and consequently, a stable RF detector voltage.

It has been recognised that many of these problems stem from a small number of common design considerations. Firstly, the placement of the components is typically determined based on the electrical requirements, not the thermal behaviour of the circuit. Secondly, the use of multipoint heating elements (such as multiple resistors) causes different distances from the heat source to each other component. Addressing these design considerations may significantly improve the way in which the temperature compensation is implemented.

Figure 10:
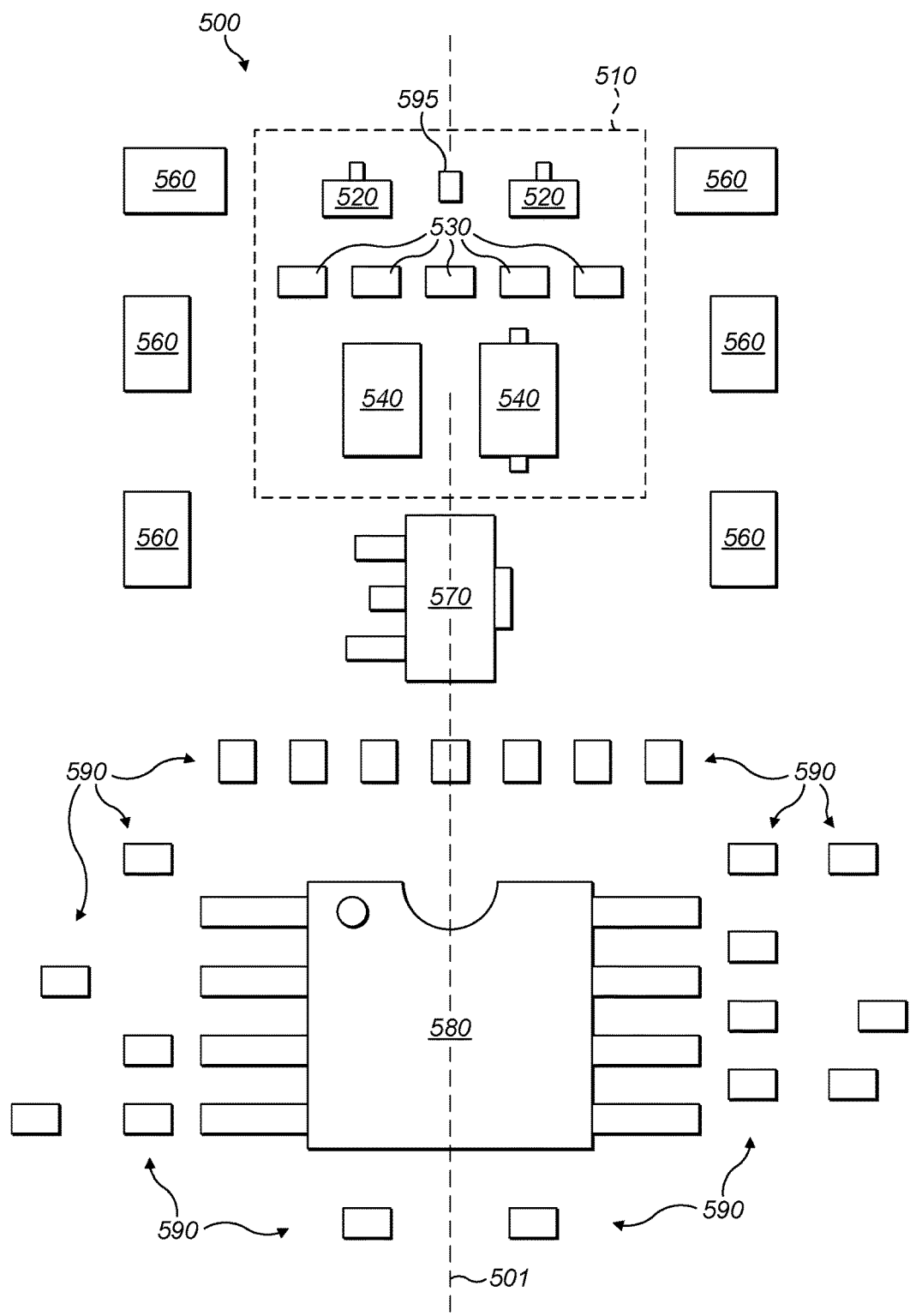
FIG. 10 schematically shows an arrangement of components for an existing ambient temperature-compensated RF detector circuit.

Considering first the placement of the components, it will be noted that conventional placement of the electrical components has a mirror symmetry (as indicated by symmetry line 501 in FIG. 10). However, this symmetry is not ideal for heat management, ensuring an equal temperature over the relatively large surface area of the PCB (in comparison with the surface area of any one component). However, other forms of symmetry may be more conducive to better thermal management, for example rotational symmetry. Moreover, further benefits may be gained by using alternative ways of heating the components to provide temperature control.

Figure 12:
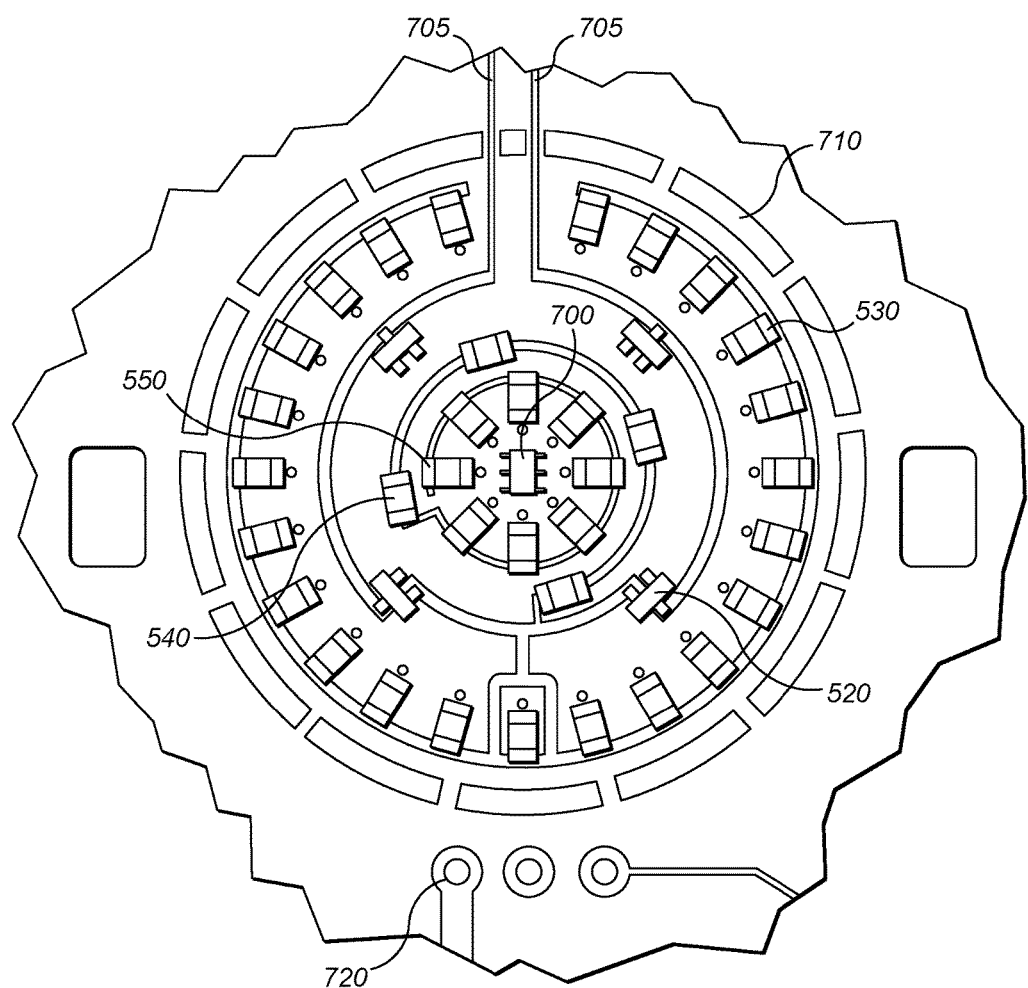
FIG. 12 illustrates a layout of components for an RF detector and thermal controller of the third embodiment on a first side of a printed circuit board.

With reference now to FIG. 12, there is illustrated a layout of components for an RF detector (a high frequency voltage detector) and thermal controller of the third embodiment on a first side of a printed circuit board. Where the components are the same as shown in FIG. 10, the same reference numerals have been used (and it may be assumed that the function of such components in FIG. 12 is the same as for FIG. 10, unless indicated otherwise). It will be seen that, unlike FIG. 10, the arrangement of components in FIG. 12 has a rotational symmetry. The components are provided along paths defined by concentric circles of differing radii.

At the centre of the circuit arrangement is provided the temperature sensor 700. Immediately surrounding this are provided capacitors 550. Surrounding the capacitors are inductors 540. Then at a wider radius, the diodes 520 are mounted. Load resistors 530 are then provided around a further circular path. Finally thermal cut-outs 710 are provided surrounding the entire circuit. These can isolate the detector circuit area from the rest of the PCB. Connections on the circuit board are provided by metal tracks, such as tracks 705 passing between two cut-outs 710, which can transport signals (voltages and/or currents) from the outside to the detector circuit and vice versa. The area of the circuit within the cut-outs is typically at least 2 cm$^2$ or 3 cm$^2$ and may be as great as 5 cm$^2$ or 10 cm$^2$. The temperature control circuit may be able to regulate for changes in temperature of at least (or greater than) 2° C./hour, 3° C./hour or 4° C./hour. It may be able to regulate for changes in temperature of up to 4° C./hour, 4.5° C./hour or 5° C./hour. Typically, the Thus, instead of using a "random" layout for the components (or even one with simple mirror symmetry), a generally rotationally symmetric placement (in form of circles or polygons defined by a respective circle) is provided. Due the radial placement of the components, all generation of heat (either induced or self-generated) will be spread radially across the circuit on the detector. Local hot spots or areas with different temperatures are avoided and the path of heat flow is even to every point in the circle area. Any component in this arrangement on the PCB thereby has the same temperature. The symmetric arrangement is applied to all components and the PCB itself.

As implied from FIG. 12, the radially symmetric placement of the components can applied to all elements of the circuit (in this case, the detector). It does not generally matter how the components are electrically connected to one another. Series and/or parallel connections can be realised in this matter. For example, it can be seen that the inductors 540 are connected in series. In contrast, the capacitors 550 are connected in parallel. Other interconnections can be made at internal layers of the PCB, but are not shown here.

In general terms of this aspect, there may therefore be considered a temperature-controlled electronic apparatus, comprising: a circuit board (such as a PCB); a plurality of electronic components, mounted on the circuit board in an arrangement to form at least one electronic circuit; a temperature sensor, configured to measure a temperature of the at least one electronic circuit; and a heat-generating component, configured to be controlled by a temperature control circuit. The temperature control circuit is configured to control an amount of heat generated by the heat-generating component in response to the temperature measured by the temperature sensor. In particular, the plurality of electronic components are arranged on the circuit board to lie on one of a one or more paths, each path being defined by (or following) a respective circle having a radius. The plurality of electronic components are typically separate from the temperature control circuit. The plurality of electronic components generally form one electronic circuit, although there may be one or more further electronic circuits formed by the plurality of electronic components in embodiments.

The one or more paths are preferably a plurality of paths. Then, each of the plurality of paths may be defined by or follow a respective concentric circle having a (different) radius. Each path may be defined by a circle and/or by a polygon having corners lying on such a circle. Where the path is defined by a polygon, the components located on the path are advantageously positioned on the corners of the polygon. The polygon is typically regular in such a case.

The temperature sensor, the heat-generating component and the temperature control circuit are normally configured to provide a closed-loop temperature control arrangement to maintain the measured temperature at a set level. The set level may be fixed, user-determined and/or typically higher than an ambient temperature (or expected ambient temperature, for instance in a laboratory). The set level may be set by means of a voltage divider, for instance, to provide a signal for comparison with a signal generated by the temperature sensor. The temperature control circuit may be a Proportion-Integral-Derivative (PID) controller, for example. The one or more paths may be a plurality of paths, in particular understood to define a common centre point. Then, the temperature sensor is advantageously located at the common centre point. This may provide improved (more accurate) temperature measurement.

Optionally, the temperature-controlled electronic apparatus further comprises a plurality of cut-outs located along a cut-out path defined by (or following) a circle concentric with the one or more paths. The circle preferably has a radius that is larger than the radius of any of the one or more paths. More preferably, the temperature-controlled electronic apparatus further comprises one or more conductive paths on the circuit board, in particular metal traces or tracks. These may be configured to provide a connection to and/or from the at least one electronic circuit, each conductive path running between respective adjacent ones of the plurality of cut-outs.

The temperature control circuit is preferably located separately from the one or more paths. In other words, it is positioned away from the plurality of electronic components forming the at least one electronic circuit. In less preferred embodiments, however, the temperature control circuit may be formed by a portion of the plurality of electronic components.

In the preferred embodiment, the temperature-controlled electronic apparatus is an RF detector and the plurality of electronic components form: a rectification stage, configured to receive an RF input signal and provide a rectified RF signal thereby; and an additional low pass filter, which may be arranged to output a signal of the amplitude of the RF input signal (as a DC level) from the rectified RF signal. The DC level comprises less ripple (fewer AC components) than the rectified RF signal. The main component of the DC level may therefore be a DC signal. In some embodiments, the DC level may have some (significantly) smaller AC component. The DC level will change gradually if and when there is a change in the amplitude of the RF input level. The rectification stage typically comprises at least one diode (and possibly multiple diodes). Preferably, the low pass filter comprises: a capacitor; and an inductor (and optionally a resistor). Optionally multiple capacitors and/or inductors and/or resistors are provided. The RF detector may form part of a control circuit for setting an amplitude of an RF potential for supplying to an electronic amplifier in an analytical instrument. In particular, the analytical instrument may be a mass spectrometer. Advantageously, the control circuit is for setting an amplitude of an RF potential for supplying to an ion optical device. The control circuit may in turn form part of a power supply for an ion optical device. An ion optical device comprising such a power supply and/or a mass spectrometer comprising such an ion optical device may further be considered.

In another aspect, a method of operating such a temperature-controlled electronic apparatus may be provided. For example, the method may comprise providing electrical signals to the electronic apparatus so as to operate the at least one electronic circuit, the temperature sensor, the heat-generating component and the temperature control circuit. Providing electrical signals to the electronic apparatus may comprise providing an input signal (beneficially an AC input signal) to the electronic circuit. The electronic circuit is preferably a rectifying circuit (for converting an AC input signal to a DC output signal). The effect of the electronic circuit acting on the input signal is typically to generate heat (which may depend on the power of the AC input signal). The method preferably further comprises measuring the temperature of the electronic circuit using the temperature sensor. Advantageously, the method further comprises controlling the heat-generating component using the temperature control circuit in response to the temperature measured by the temperature sensor.

Additionally or alternatively, a method of manufacturing a temperature-controlled electronic apparatus as described herein may be considered. Any such methods may have one or more functional steps corresponding with functionality of any specific apparatus or device herein is also provided.

This idea, in both its general sense and specific cases, allows the components to be placed in a radial fashion (defined by a radius and angle: r,θ), rather than in a conventional "Cartesian" fashion (defined by respective positions on each of two perpendicular axes, such as x,y). Advantageously, this permits the plurality of electronic components to be positioned on a surface of the circuit board, such that the plurality of electronic components on the surface generally have rotational symmetry. In this way, the heat spread throughout the components may be spread more evenly.

Figure 13:
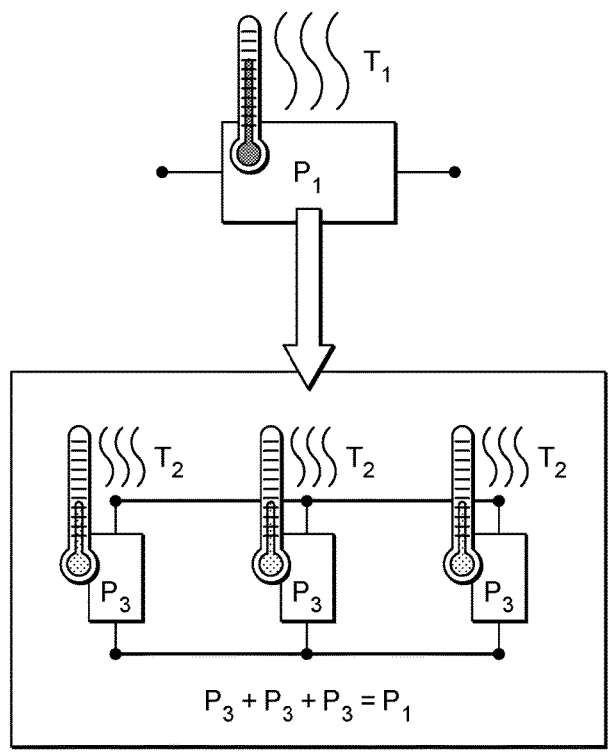
FIG. 13 shows one principle of operation of the embodiment of FIG. 12.

Referring to FIG. 13, there is shown one principle of operation of the embodiment of FIG. 12. To further improve the thermal management, the components are additionally spread out over the PCB. For each functional component, multiple devices are provided (in series if the device is controlled or responsive to current, such as an inductor, or in parallel if it is controlled or responsive to voltage, such as a capacitor or rectifying diode), in order to reduce the temperature of each individual device. For example, multiple rectifying diodes may be placed in parallel, to reduce the current flowing through each diode accordingly. The rise in temperature due to the power dissipation is proportional to the applied power in electronic devices ($P_{loss} \approx T_{rise}$). As shown in FIG. 13, a single component consuming (and dissipating) a power $P_1$ and having a temperature $T_1$ may be replaced by three components each dissipating a power $P_3$ and having a temperature $T_2$. Although the total power consumed is the same ($3 \times P_3 = P_1$), the temperature may be lowered, such that $T_2 < T_1$. Using this technique, the total power consumed by the components is less densely concentrated on the PCB and the self-generated heat is shared between components. By dispersing the power dissipated per unit area, the thermal management is improved.

In a general sense it may be understood that a portion of the plurality of electronic components forming the at least one electronic circuit comprise at least one set (and preferably multiple sets) of duplicated electronic components, the electronic components in each set of duplicated electronic components being configured to have the same function and dissipate the same power in use. The components in each set of duplicated components are typically mounted on the same path of the circuit board.

Figure 14:
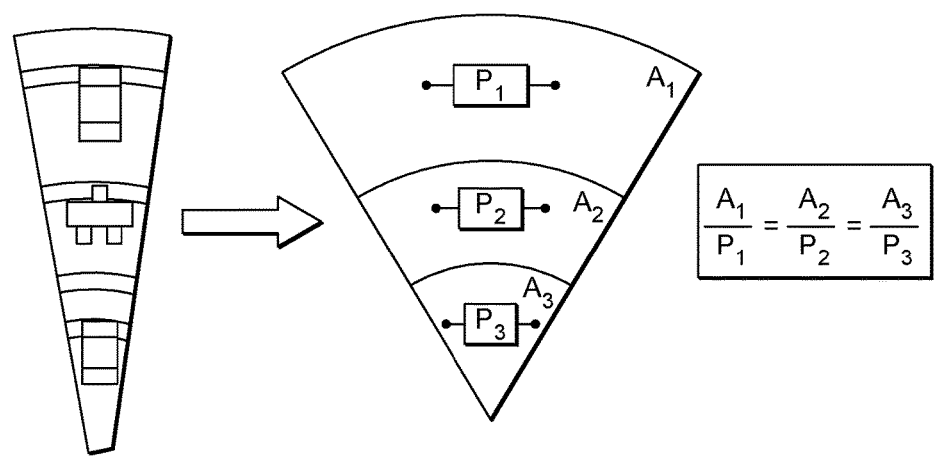
FIG. 14 depicts another principle of operation of the embodiment of FIG. 12.

The placement of the electronic components on the circuit board is noted above as having a rotational symmetry. As explained there, this allows better heat dissipation. Further improvements to the positioning of the components can be made, though. Referring now to FIG. 14, there is depicted another principle of operation of the embodiment of FIG. 12. The electronic components are placed in order to keep a ratio of the power dissipated to the area covered by the component or assigned to the component as fixed or constant. Thus, a more power consuming (and hence dissipating) device, dissipating power $P_1$ is assigned a larger surface area $A_1$ than a less power consuming (and hence dissipating) device, dissipating power $P_2$, assigned a smaller surface area $A_2$. This is achieved in the layout of FIG. 12, by placing the less power dissipating device on a path having a smaller radius than the path on which the more power dissipating device is placed. Thus, an even lower dissipating device (dissipating power $P_3$) is assigned an even smaller surface area $A_3$. In this way, the power dissipated per unit area may be kept constant, thereby keeping the temperature due to self-generated heat constant across the circuit and mitigating thermal influences between one component to another.

From the general sense discussed above, it will be noted that each of the plurality of electronic components is configured to dissipate a respective power in use. Then, each electronic component may arranged on a path in accordance with its respective dissipated power in use. Additionally or alternatively, the plurality of electronic components may be arranged such that electronic components configured to dissipate a higher power in use are arranged on a path having a larger radius than a radius of a path on which electronic components configured to dissipate a lower power in use are arranged. In particular embodiments, the plurality of electronic components may be arranged such that electronic components configured to dissipate the same power in use are arranged on the same path.

Beneficially, if a first electronic component is arranged on a first path having a first radius and a second electronic component is arranged on a second path adjacent to the first path (the second path having a second radius greater than the first radius), the distance between the first radius and second radius is based on the power that the second component is configured to dissipate in use.

In another sense, the plurality of electronic components may be arranged on the circuit board along the one or more paths and separated from one another such that, for each of the plurality of electronic components, the ratio of an area surrounding the respective electronic components in which no other electronic components are located to the power that the respective electronic component is configured to dissipate in use, is approximately the same (across all of the at least one electronic circuit or at least one of a plurality of electronic circuits). The ratio may be approximately the same if the variation between the ratio for one component varies from the ratio of another component by no more (or less) than 10%, 5%, 2%, 1% or 0.5% and/or if the ratios differ by no more (or less) than 0.1, 0.05, 0.01 or 0.005.

Figure 15:
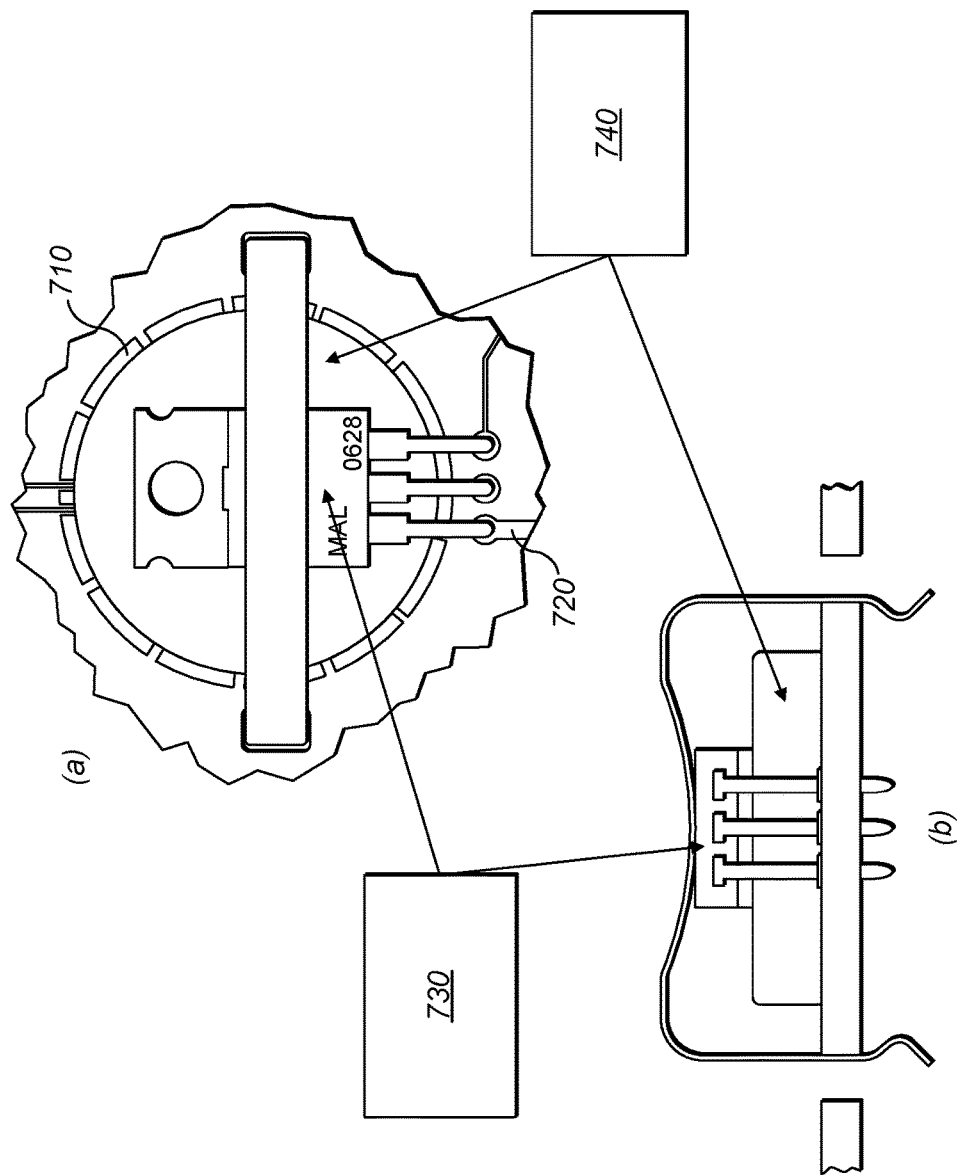
FIG. 15 illustrates two views of components on a second side of the printed circuit board of the embodiment shown in FIG. 12.

Referring next to FIG. 15, there are illustrated two views of components on a second side of the printed circuit board (opposite the side shown in FIG. 12) of the embodiment shown in FIG. 12. A top view (a) and a side view (b) are shown. The thermal cut-outs 710 that were visible in FIG. 12 can also be seen in the top view (a). The heat generating device is a transistor 730 mounted on a heat spreader 740. The transistor 710 is connected to the circuit at connections 720, which are also visible in FIG. 12 on the other side of the PCB. Although one heating transistor 730 is shown, multiple heating transistors could be used instead. The use of a single active component (in this case a transistor) as a heat generator is particularly beneficial, as it combines the advantage of a linear relationship between current or voltage and power dissipated in the device with the possibility to place the heat source in a symmetrical way to the circuit. The linear power relationship of the transistor contrasts with the quadratic expression for power dissipated (and hence its heating effect) to voltage or current in a resistor, as discussed above.

The heat spreader 740 is advantageously made of metal and extends across the back side of the PCB up to the thermal cut-outs 710 and therefore over the whole surface area behind the circuit on the other side. The heat spreader 740 spreads the heat across the surface area of the PCB to keep the temperature stable and reduce the time taken for temperature equilibrium to be achieved once heat is generated. In addition, the multiple planes of copper are beneficially provided in the inner layers of the PCB. This may improve heat spreading and also acts as an RF shielding. Through the use of metal (instead of PCB FR4 material), with its greater thermal conductivity, the time constant of heat equalising processes is greatly reduced. One particular advantage of the heat spreader is to shield the voltage divider 630 and thereby keep a stable reference level for the temperature control.

In a preferred embodiment of the general sense discussed above, the plurality of electronic components are located on a first side of the circuit board and the heat-generating component is located on a second side of the circuit board (the second side being opposite the first side). It may be understood that the one or more paths define a centre point (or a common centre point if there are a plurality of paths) and then, the heat-generating component is advantageously located at the centre point or with its centre generally at or close to the centre point (for example, no further away than the closest of the one or more paths to the centre point).

Preferably, the heat-generating component is mounted on a heat spreader. Advantageously, the heat spreader is arranged to extend across the second side of the circuit board co-extensive with the one or more paths defined on the first side of the circuit board. More preferably, the heat spreader is arranged to extend up to the cut-outs.

Beneficially, the heat-generating component comprises a heating transistor. This may provide significant benefits over one or more heating resistors, due to the non-linear voltage-current relationship for the transistor in comparison with the linear voltage-current relationship for a resistor.

In the preferred embodiment, the circuit board comprises multiple (preferably planar) metal layers. These may provide heat spreading and RF shielding effects. They may also provide circuit interconnections. The metal layers advantageously comprise (and more preferably are or are formed of) copper.

Key advantages of the technique described here include: the use of single heating device with equal distances to the point of use; a cost saving, as no heating resistors are required; no linear relationship in the transistor between collector current and collector-emitter voltage; the closed-loop operation circuit uses a linear relationship between the voltage applied to the transistor and the dissipated power, so that the supplied power can be better controlled; high symmetry for all component yields an even heat distribution on the PCB surface; self-heating is decreased (to a minimum) due to the load-sharing effect of multiple electrical components; equal temperatures are achievable due to constant area to dissipated power ratios; a fast thermal time constant is achieved due to the use of metal for heat transport; and heat conduction, convection and radiation is used as main transferring mechanism, due to the heat establishment on the top and bottom of the circuit.

In particular, it should be noted that the temperature control may fix the circuit temperature to between 40° C. and 75° C., preferably between 55° C. and 65° C. and more preferably between 58° C. and 60° C. Moreover, the number of devices used in the arrangement of FIG. 12 is in fact lower than that of FIG. 10. For example, the number of load resistors 530 are reduced from 36 in the embodiment of FIGS. 10 to 18 in the FIG. 12 embodiment.

Ion Optical Device Implementation

In another generalised aspect, there may be considered a control circuit for setting an amplitude of an RF potential for supplying to an electronic amplifier in an analytical instrument (such as a mass spectrometer). The control circuit may particularly be for setting an amplitude of an RF potential for supplying to an ion optical device. The control circuit beneficially comprises: a controller, configured to receive an RF signal from an RF generator, to receive a signal (DC level) indicative of the amplitude of the RF potential and to generate an RF output from the received RF signal, adjusted on the basis of the received signal indicative of the amplitude of the RF potential; an output circuit, arranged to generate the RF potential for supplying to an ion optical device from the RF output of the controller; and an RF detector as herein described, configured to receive the RF potential and to generate the signal indicative of the amplitude of the RF potential for the controller. Optionally, the output circuit comprises an RF amplifier, arranged to receive the RF output from the controller and to amplify the RF output. Then, the output circuit may further comprise a transformer, configured to receive the amplified RF output as a primary-side input and to provide the RF potential as a secondary-side output. Optionally, the output circuit may also comprise a voltage divider, configured to couple the RF potential from the secondary side of the transformer to the RF detector.

There may also be provided a power supply for an ion optical device, comprising: an RF generator, configured to generate an RF signal; and a control circuit as herein disclosed, configured to receive the RF signal from the RF generator and provide the RF potential to the ion optical device. In yet another aspect, there may be considered an ion optical device, comprising: an electrode arrangement for generating an RF electrical field using a received RF potential; an RF generator, configured to generate an RF signal; and a control circuit as described herein, configured to receive the RF signal from the RF generator and provide the RF potential to the electrode arrangement.

It has been shown in FIG. 3 (described above), how to implement an RF potential power supply for an ion optical device, using an RF detector. More details about the ion optical device and its use will now be considered. In particular, the ion optical device is preferably a quadrupole ion optical device, such as a quadrupole ion trap, quadrupole mass filter or quadrupole mass analyser, typically forming part of a mass spectrometer.

In a preferred embodiment, the ion optical device forms part of a mass spectrometer with an inductively coupled plasma (ICP) ion source, in particular for elemental analysis. In particular, the mass spectrometer may have two or more analysers for the investigated ions. The first analyser is a collision/reaction cell (QCell), for example having a flat quadrupole electrodes (a "flatapole"). The second analyser is a quadrupole ion optical device for the isolation of the ions to be measured. An improvement on such a mass spectrometer with two analysers has an additional mass analyser, normally a further quadrupole ion optical device, which therefore provides a triple-quadrupole mass spectrometer. The additional quadrupole is positioned upstream of the collision/reaction cell. Such a mass spectrometer is disclosed in our co-pending UK patent application no. 1516508.7 and details of this will now be briefly discussed for the sake of completeness.

Figure 9:
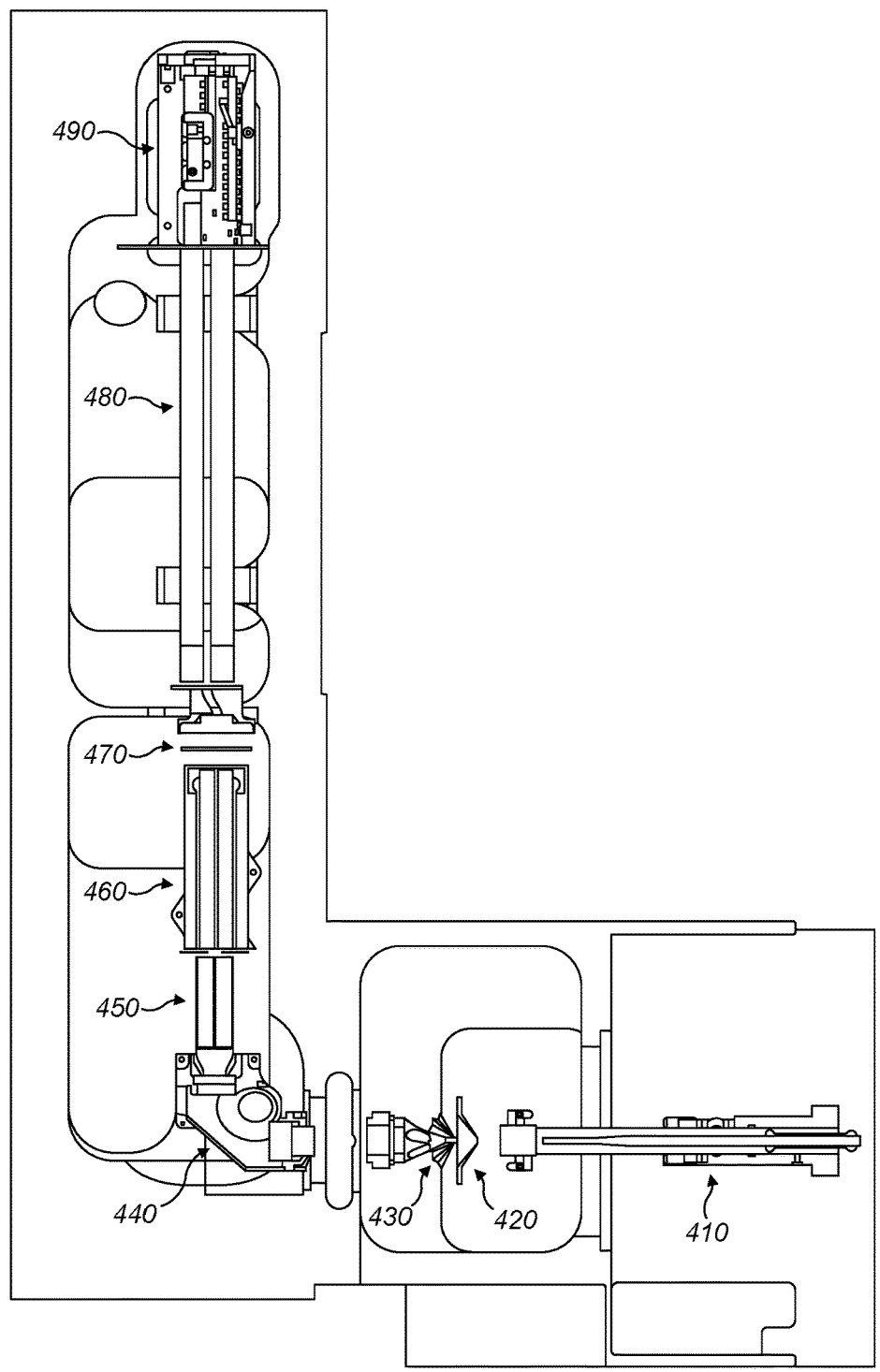
FIG. 9 shows a schematic illustration of a known ICP mass spectrometer, with which the invention may be used.

With reference to FIG. 9, there is shown a schematic illustration of a known ICP mass spectrometer, with which an ion optical device as herein disclosed may be used. This ICP mass spectrometer comprises: an ICP torch 410; a sampler cone 420; a skimmer cone 430; ion optics 440; a first (Q1) mass filter 450; a reaction cell (Q2) 460; a differentially pumped aperture 470; a second (Q3) mass filter 480; and an ion detector 490. The Q3 mass filter 480 may be considered a mass analyser or a part of a mass analyser. In this design, ions are produced in the ICP torch 410, introduced into vacuum via sampler 420 and skimmer 430, transported through (bending) ion optics 440 and selected by Q1 quadrupole mass filter 450. It will be noted that Q1 mass filter 450 is relatively short in comparison with Q2 reaction cell 460 and Q3 mass filter 480, and is schematically depicted so. Moreover, the vacuum conditions of the Q1 mass filter 450 are less demanding than for the subsequent stages. Here, the ion optics 440 and Q1 mass filter 450 are operated at substantially the same pressure. Ions of the selected mass range pass into the quadrupole reaction cell 460 and the reaction product is directed through ion optics and differentially pumped aperture 470 into the analytical quadrupole mass filter Q3 480 and detected by high dynamic range detector 490, for example an SEM. The Q3 mass filter 480 is highly selective (especially in comparison with the Q1 mass filter 450), and has a band-pass width of typically no greater than 1 amu.

The Q1 quadrupole mass filter 450 selects a limited set of ions to be investigated. The Q1 mass filter 450 advantageously has a lower resolution than the Q3 mass filter 480. As noted above, the Q1 mass filter 450 is a short quadrupole having typically a length of the electrode in axial direction of the quadrupole of 5 to 7 cm. This quadrupole is advantageously less expensive to manufacture than the Q2 cell 460 and Q3 mass filter 480. However, it has a much wider band-path width than the Q3 mass filter 480, downstream the Q2 collision/reaction cell 460.

Ions having a mass-to-charge ratio A within a range of interest are preferably positioned in the flank of the band-path of the Q1 mass filter 450, to avoid significant interference. Downstream the Q2 reaction/collision cell 460, the ions of interest detected by the Q3 mass filter 480 have a mass-to-charge ratio of A+R. If the interference level detected by the high resolution Q3 mass filter 480 is still high, a shift of the isolation window of the Q1 mass filter 450 is implemented, to improve the measurement results. Due to the positioning of the mass of interest A in the flank of the band-path of the Q1 mass filter 450 and the issue that incorrect adjustment of the isolation window of the quadrupole 450 problem results in increased interference, the voltage supply to the electrodes of Q1 mass filter can have a significant effect on the performance of the mass spectrometer. Therefore, any external influence on the electronics providing the voltage for the electrodes, such as temperature changes, are desirably minimised. The use of a power supply for providing the RF potential to the Q1 mass filter 450 in such a mass spectrometer may therefore be highly advantageous. The use of such a power supply for providing the RF potential to the Q3 mass filter 480 is also of potential benefit.

This challenge is made more difficult by the normal measuring mode of this mass spectrometer, which unlike other types of mass spectrometer, does not measure a full range of masses. Instead, it is configured to measure only specific masses that are to be analysed. Typically, ICP mass spectrometers are used for routine measurements, for example to test the purity of water. These routine measurements have to be quickly carried out. Typically, 10 sweeps of 4 seconds are performed using the mass spectrometer, for each investigated mass, leading to a measurement time of from 10 to 20 seconds up to 1.5 minutes. Up to 30 different masses may be analysed for each investigated sample.

As a result of such operating modes, the supplied RF voltage or voltages (particularly to the Q1 mass filter 450 and the Q3 mass filter 480) may change very fast. The temperature caused by the applied RF voltage may then also change quickly, such that conventional temperature compensation may be not fast enough. Other types of mass spectrometer measuring only specific masses (rather than a full range of masses) may also face a similar challenge. The average power dissipation in the RF detector (particularly due to the rectifying diode) and consequent temperature increase will generally depend on the mass of the ions being analysed. A lower mass ion (such as Lithium, Li) will cause a lower power dissipation than a higher mass ion (for example, Cobalt, Co). In particular, a very high mass ion, such as Uranium (U) will have a much higher power dissipation than a lower mass ion, such as Copper (Cu). The Q1 mass filter 450 will typically be required to handle ions of masses between that of Magnesium (Mg) and Gold (Au), whereas the Q3 mass filter 480 will typically be required to handle a wider range of masses, for instance ions of masses between that of Lithium (Li) and Uranium (U). As each mass filter analyses ions of different mass, the temperature of the RF detector increases with higher mass and decreases with lower mass. The temperature increase when analysing U immediately after analysing Li could be as high as 60° C. and this could increase could occur within 100 μs.

A mass spectrometer comprising an ion optical device as herein disclosed should therefore be considered in a generalised sense. The mass spectrometer may have one or more of: an ICP source; a triple-quadrupole configuration; a configuration for elemental analysis; a controller for measurements of a single nominal mass-to-charge ratio; and a configuration to carry out a measurement in no more than 1.5 minutes, 1 minute, 45 seconds, 30 seconds, 20 seconds, 15 seconds, 10 seconds, 5 seconds, 4 seconds 2 seconds, 1 second, 0.5 seconds, 0.1 seconds, 0.05 seconds, 0.01 seconds, 0.005 seconds or 0.001 seconds. A typical time duration for an average mass measurement is between 1 ms and 5 s.

Any of the general approaches disclosed herein can be implemented as a computer program or programmable or programed logic, configured to perform any method described herein when operated by a processor. The computer program may be stored on a computer readable medium.

Any controller herein described may be configured to operate in accordance with any method steps (alone or in combination) described herein. It may have structural features (one or more of: one or more inputs; one or more outputs; one or more processors; logic; and circuitry) configured to perform any one or more of these method steps. Such a controller may comprise a computer or processor for executing a computer program or programmable or programmed logic configured to perform any of the methods described herein.

It will be appreciated that variations to the foregoing embodiments can be made while still falling within the scope of the invention. Although the invention has been described with reference to a particular type of circuit and application (an RF detector circuit for an ion optical device) and the invention has particular advantages in such case, as discussed herein, the invention may be applied to other types of circuit and/or application. Each feature disclosed in this specification, unless stated otherwise, may be replaced by alternative features serving the same, equivalent or similar purpose. Thus, unless stated otherwise, each feature disclosed is one example only of a generic series of equivalent or similar features.

As used herein, including in the claims, unless the context indicates otherwise, singular forms of the terms herein are to be construed as including the plural form and vice versa. For instance, unless the context indicates otherwise, a singular reference herein including in the claims, such as "a" or "an" (such as an analogue to digital convertor) means "one or more" (for instance, one or more analogue to digital convertor). Throughout the description and claims of this disclosure, the words "comprise", "including", "having" and "contain" and variations of the words, for example "comprising" and "comprises" or similar, mean "including but not limited to", and are not intended to (and do not) exclude other components.

The use of any and all examples, or exemplary language ("for instance", "such as", "for example" and like language) provided herein, is intended merely to better illustrate the invention and does not indicate a limitation on the scope of the invention unless otherwise claimed. No language in the specification should be construed as indicating any non-claimed element as essential to the practice of the invention.

Any steps described in this specification may be performed in any order or simultaneously unless stated or the context requires otherwise.

All of the aspects and/or features disclosed in this specification may be combined in any combination, except combinations where at least some of such features and/or steps are mutually exclusive. As described herein, there may be particular combinations of aspects that are of further benefit, such as the use of combined temperature-compensated components in a temperature-compensated circuit. In particular, the preferred features of the invention are applicable to all aspects of the invention and may be used in any combination. Likewise, features described in non-essential combinations may be used separately (not in combination).

The invention claimed is:

1. A temperature-compensated rectifying component, configured to receive an input signal and comprising:
    a diode part, for rectifying the received input signal and providing a rectified output signal thereby, the diode part having an operational temperature;
    a temperature compensation controller, configured to control a power dissipated by the diode part over a predetermined period of time, such that an average of the operational temperature over the predetermined period of time meets pre-set criteria, wherein the temperature-compensated rectifying component forms part of a bridge rectifier circuit.

2. The temperature-compensated rectifying component of claim 1, wherein the temperature compensation controller is configured to control a total power dissipated by the diode part over the predetermined period of time to be a set level, such that the average of the operational temperature over the predetermined period of time is approximately constant.

3. The temperature-compensated rectifying component of claim 1, wherein the diode part comprises:
    a first diode, arranged to receive the input signal and configured to rectify the input signal, so as to provide the rectified output signal; and
    at least one further diode, thermally coupled to the first diode; and
    wherein the temperature compensation controller is configured to set a power dissipated by the at least one further diode based on a power dissipated by the first diode and such that the total power dissipated by the first diode and the at least one further diode over the predetermined period of time is a set level.

4. The temperature-compensated rectifying component of claim 1, wherein the temperature compensation controller is configured to control the operation of the diode part such that: during a first portion of the predetermined period of time, the diode part provides the rectified output signal based on the received input signal; and during a second portion of the predetermined period of time, non-overlapping with the first portion of the predetermined period of time, the diode part provides the rectified output signal based on a compensation signal, the compensation signal being set such that the power dissipated by the diode part over the predetermined period of time is a set level.

5. The temperature-compensated rectifying component of claim 4, wherein the temperature compensation controller is configured to set the amplitude of the compensation signal and/or the duration of the second portion of the predetermined period of time such that the power dissipated by the diode part over the predetermined period of time is a set level.

6. The temperature-compensated rectifying component of claim 1, wherein the predetermined period of time is a first predetermined period of time, the temperature compensation controller being configured to control the power dissipated by the diode part over a second predetermined period of time subsequent to the first predetermined period of time, such that an average of the operational temperature over the second predetermined period of time meets the pre-set criteria.

7. A temperature-compensated rectifying component, configured to receive an input signal and comprising:
    a diode part, for rectifying the received input signal and providing a rectified output signal thereby, the diode part having an operational temperature;
    a temperature compensation controller, configured to control a power dissipated by the diode part over a predetermined period of time, such that an average of the operational temperature over the predetermined period of time meets pre-set criteria, wherein the diode part comprises:
    a first diode, arranged to receive the input signal and configured to rectify the input signal, so as to provide the rectified output signal; and
    at least one further diode, thermally coupled to the first diode; and
    wherein the temperature compensation controller is configured to set a power dissipated by the at least one further diode based on a power dissipated by the first diode and such that the total power dissipated by the first diode and the at least one further diode over the predetermined period of time is a set level, wherein the at least one further diode comprises:
    a second diode, thermally coupled to the first diode; and
    wherein the temperature compensation controller comprises a compensation current source, configured to provide a compensation current to the second diode, the compensation current being adjusted in an inverse relationship to the operational temperature of the diode part.

8. The temperature-compensated rectifying component of claim 7, further comprising:
    a temperature sensor, configured to generate a signal indicative of the operational temperature of the diode part, the compensation current being generated in response to the signal indicative of the operational temperature of the diode part and wherein the temperature sensor is thermally coupled to the first and second diodes.

9. The temperature-compensated rectifying component of claim 7, wherein the at least one further diode comprises:
    a third diode, thermally coupled to the first and second diodes; and wherein the temperature compensation controller further comprises a constant current source, coupled to draw a constant current through the third diode, the potential at an anode of the third diode thereby indicating the operational temperature of the diode part and wherein the compensation current is set based on the potential at the anode of the third diode.

10. The temperature-compensated rectifying component of claim 9, wherein the temperature compensation controller comprises an operational amplifier circuit, configured to set the compensation current based on the potential at the anode of the third diode.

11. An RF detector for generating a DC level from a RF input signal, comprising:
   a rectification stage, configured to receive the RF input signal and provide a rectified RF signal thereby, the rectification stage comprising at least one temperature-compensated rectifying component in accordance with any preceding claim; and
   a low pass filter, arranged to provide a signal indicative of the amplitude of the RF input signal from the rectified RF signal,
   wherein the at least one temperature-compensated rectifying component is a plurality of temperature-compensated rectifying components forming a bridge rectifier.

12. The RF detector of claim 11, further comprising:
   an ambient temperature compensator, configured to heat the diode part in response to a determination that the operational temperature of the diode part is less than a set temperature.

13. A control circuit for setting an amplitude of an RF potential for supplying to an electronic amplifier in an analytical instrument, the control circuit comprising:
   a controller, configured to receive an RF signal from an RF generator, to receive a signal indicative of the amplitude of the RF potential and to provide an RF output from the received RF signal, adjusted on the basis of the received signal indicative of the amplitude of the RF potential;
   an output circuit, arranged to generate the RF potential for supplying to an ion optical device from the RF output of the controller; and
   the RF detector of claim 11, configured to receive the RF potential and to generate the signal indicative of the amplitude of the RF potential for the controller.

14. The control circuit of claim 13, wherein the output circuit comprises:
   an RF amplifier, arranged to receive the RF output from the controller and to amplify the RF output; and
   a transformer, configured to receive the amplified RF output as a primary-side input and to provide the RF potential as a secondary-side output.

15. An ion optical device, comprising:
   an electrode arrangement for generating an RF electrical field using a received RF potential;
   an RF generator, configured to generate an RF signal; and
   a control circuit in accordance with claim 13, configured to receive the RF signal from the RF generator and provide the RF potential to the electrode arrangement.

* * * * *